(12) United States Patent
Tanizaki

(10) Patent No.: US 11,646,211 B2
(45) Date of Patent: May 9, 2023

(54) MEASURING DEVICE, MEASURING METHOD, AND SEMICONDUCTOR STORAGE DEVICE

(71) Applicant: Kioxia Corporation, Tokyo (JP)

(72) Inventor: Hiroyuki Tanizaki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 266 days.

(21) Appl. No.: 17/189,738

(22) Filed: Mar. 2, 2021

(65) Prior Publication Data

US 2022/0068678 A1 Mar. 3, 2022

(30) Foreign Application Priority Data

Aug. 26, 2020 (JP) .............................. JP2020-142878

(51) Int. Cl.
*H01L 21/67* (2006.01)
*H01L 21/311* (2006.01)
(Continued)

(52) U.S. Cl.
CPC ........ *H01L 21/67253* (2013.01); *G01B 15/02* (2013.01); *G01B 15/04* (2013.01); *G01B 17/06* (2013.01); *G06T 7/0004* (2013.01); *G06T 7/564* (2017.01); *H01L 21/31111* (2013.01); *H01L 21/31144* (2013.01); *H01L 22/26* (2013.01);
(Continued)

(58) Field of Classification Search
CPC .... G01B 11/0625; G01B 15/02; G01B 15/04; G01B 15/045; G01B 17/06; G01B 2210/56; G01B 2207/10116; G01B 2207/30148; G01B 7/0004; G01B 7/564; H01L 21/31111; H01L 21/31116; H01L 21/31144; H01L 21/67253; H01L 22/12; H01L 22/26; H01L 23/5226;
(Continued)

(56) References Cited

U.S. PATENT DOCUMENTS 9,885,962 B2 2/2018 Veldman et al.
10,352,695 B2 7/2019 Dziura et al.
(Continued)

FOREIGN PATENT DOCUMENTS

JP 2019-505766 A 2/2019
JP 6629193 B2 1/2020
(Continued)

*Primary Examiner* — Mark R Gaworecki
(74) *Attorney, Agent, or Firm* — Foley & Lardner LLP

(57) ABSTRACT

A measuring device includes a measuring stage on which a subject is placed, an X-ray irradiation unit, an X-ray detection unit that detects scattered X-rays generated from the subject and an analysis unit that analyzes the diffraction image obtained by photo-electrically converting scattered X-rays and presumes (estimates) the three-dimensional shape of the subject. In the subject, holes are formed in the ON stack film from the opening of the etching mask film formed on the ON stack film. The analysis unit presumes the three-dimensional shape of the subject based a plurality of the diffraction images acquired while changing a rotation angle of the measuring stage and the measurement data of the subject by at least one of measuring methods of a multi-wavelength light measurement and a laser ultrasonic wave measurement.

19 Claims, 21 Drawing Sheets

(51) Int. Cl.
*H01L 27/11582* (2017.01)
*H01L 27/11529* (2017.01)
*H01L 27/11573* (2017.01)
*H01L 23/522* (2006.01)
*G01B 15/02* (2006.01)
*G01B 15/04* (2006.01)
*G01B 17/06* (2006.01)
*G06T 7/00* (2017.01)
*G06T 7/564* (2017.01)
*H01L 21/66* (2006.01)
*H01L 27/11556* (2017.01)

(52) U.S. Cl.
CPC .... *H01L 23/5226* (2013.01); *H01L 27/11529* (2013.01); *H01L 27/11556* (2013.01); *H01L 27/11573* (2013.01); *H01L 27/11582* (2013.01); *G06T 2207/10116* (2013.01); *G06T 2207/30148* (2013.01)

(58) Field of Classification Search
CPC ......... H01L 27/11529; H01L 27/11556; H01L 27/11573
See application file for complete search history.

(56) References Cited

U.S. PATENT DOCUMENTS

| | | | |
|---|---|---|---|
| 2007/0224518 A1* | 9/2007 | Yokhin | G03F 7/70633 430/5 |
| 2013/0243154 A1* | 9/2013 | Ishibashi | G01N 23/20 378/54 |
| 2017/0184981 A1* | 6/2017 | Quintanilha | G03F 7/70633 |
| 2018/0188192 A1* | 7/2018 | Artemiev | G01N 23/201 |
| 2018/0364036 A1* | 12/2018 | Jak | G03F 7/70683 |
| 2019/0227006 A1* | 7/2019 | Ogata | G01N 23/20025 |
| 2020/0100350 A1* | 3/2020 | Van Voorst | G01N 21/956 |
| 2020/0184372 A1* | 6/2020 | Wu | G01N 21/9501 |
| 2020/0201192 A1* | 6/2020 | Smorenburg | G03F 7/70625 |
| 2021/0063329 A1* | 3/2021 | Kuznetsov | G01N 23/20008 |

FOREIGN PATENT DOCUMENTS

| | | | |
|---|---|---|---|
| WO | WO-2010051108 A2 * | 5/2010 | G01S 13/0209 |
| WO | WO-2020194986 A1 * | 10/2020 | G01N 23/20016 |

* cited by examiner

Fig. 5
DIFFRACTION IMAGE
(SAXS IMAGE)
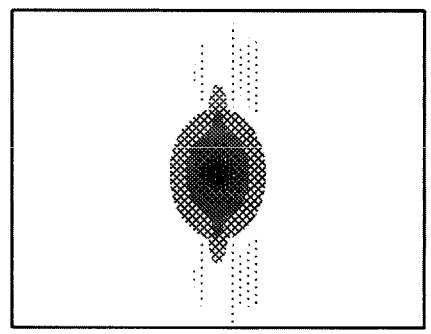 +1.0°
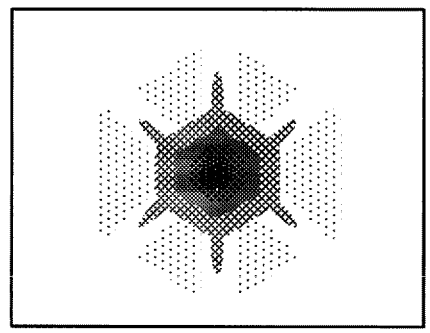 0.0°
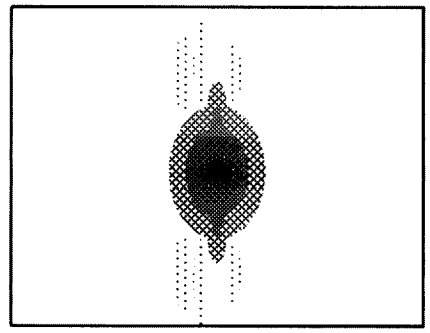 −1.0°

MEASURING DEVICE, MEASURING METHOD, AND SEMICONDUCTOR STORAGE DEVICE

CROSS-REFERENCE TO RELATED APPLICATION(S)

This application is based upon and claims the benefit of priority from Japanese Patent Application No. 2020-142878, filed Aug. 26, 2020, the entire contents of which are incorporated herein by reference.

FIELD

At least one embodiment relates to a measuring device, a measuring method, and a semiconductor storage device.

BACKGROUND

As a device for measuring a depth of deep holes and deep grooves formed in a film-forming site on a semiconductor substrate and a three-dimensional shape of a side wall, a measuring device using a technology of Transmission Small Angle X-ray Scattering (hereinafter, referred to as T-SAXS) is known.

DESCRIPTION OF THE DRAWINGS

FIG. 5 is a diagram illustrating a relationship between an incident angle of X-rays and a diffraction image.

DETAILED DESCRIPTION

At least one embodiment provides a measuring device, a measuring method, and a semiconductor storage device that can non-destructively and accurately measure an interface between an etching mask and a film to be processed and a three-dimensional shape of a hole processed by etching.

In general, according to at least one embodiment, a measuring device includes: a stage on which a subject is placed; an X-ray irradiation unit that causes the stage to be irradiated with X-rays; an X-ray detection unit that detects scattered X-rays emitted from the subject by the irradiation with the X-rays; and an analysis unit that analyzes a diffraction image obtained by photo-electrically converting the scattered X-rays and presumes (estimates) a front surface contour shape of a measurement area irradiated with the X-rays on the subject.

A first film and a second film formed of a material different from the first film are stacked in the measurement area of the subject, and a hole portion penetrating the second film is formed in a part of the measurement area.

The stage is rotatable with respect to an axis parallel to a plane on which the subject is placed.

In addition, the analysis unit presumes the front surface contour shape including an interface between the first film and the second film in the measurement area of the subject based on a plurality of the diffraction images acquired by changing a rotation angle of the stage with respect to the axis and measurement data obtained by measuring the subject using at least one of measuring methods of a multi-wavelength light measurement or a laser ultrasonic wave measurement.

Hereinafter, embodiments of the present disclosure will be described with reference to the drawings.

FIRST EMBODIMENT

Figure 1:
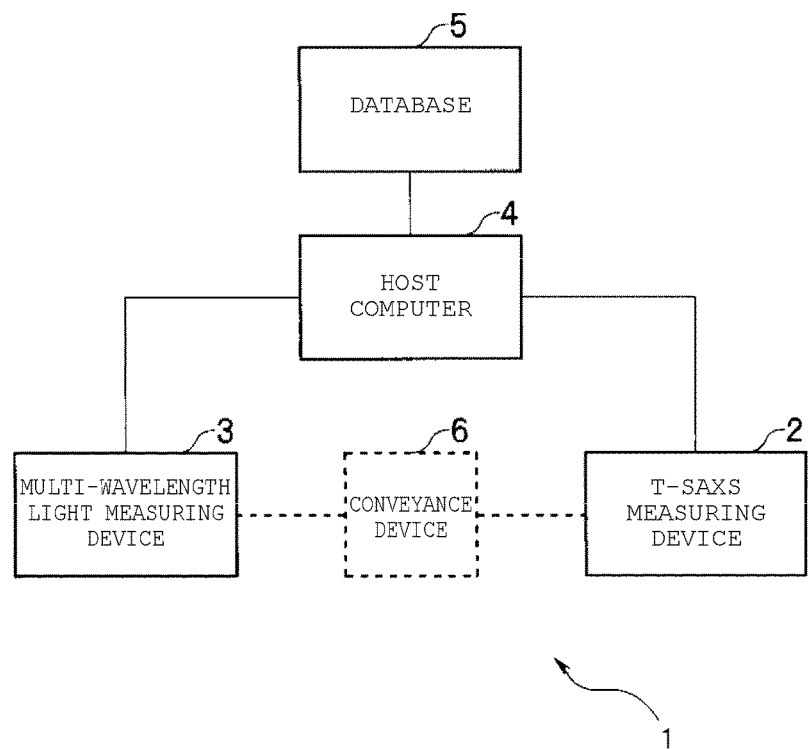
FIG. 1 is a block diagram showing a configuration example of a measurement system including a measuring device according to a first embodiment.

FIG. 1 is a block diagram showing a configuration example of a measurement system including a measuring device according to a first embodiment. A measurement system 1 in the present embodiment includes a T-SAXS measuring device 2, a multi-wavelength light measuring device 3, a host computer 4, and a database 5. The measurement system 1 in at least one embodiment is used to measure a three-dimensional shape of a periodic pattern formed on a front surface of a subject. More specifically, the measurement system 1 in the embodiment is used to measure a three-dimensional shape profile including a depth of a hole formed in the subject and a thickness of a film, for example. The measurement system 1 may include a conveyance device 6 that conveys the subject between the T-SAXS measuring device 2 and the multi-wavelength light measuring device 3. In addition, the measurement system 1 may further include a display device for displaying the data acquired during the measurement.

The T-SAXS measuring device 2 is a device that measures the three-dimensional shape of the periodic pattern formed on the front surface of the subject using transmitted X-rays. Using a plurality of diffraction images (SAXS image groups) acquired by changing the angle of incidence of X-rays on the subject, it is possible to measure the average three-dimensional shape of the periodic pattern formed within a spot size (for example, a spot size approximately 50 to 1000 μm square).

Figure 2:
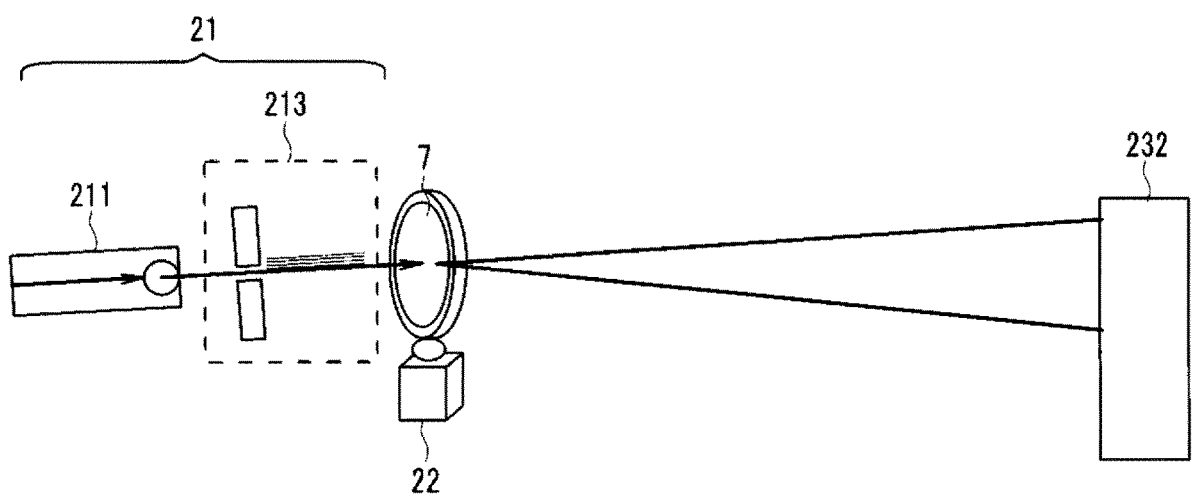
FIG. 2 is a schematic view illustrating an example of a configuration of a T-SAXS measuring device.
Figure 3:
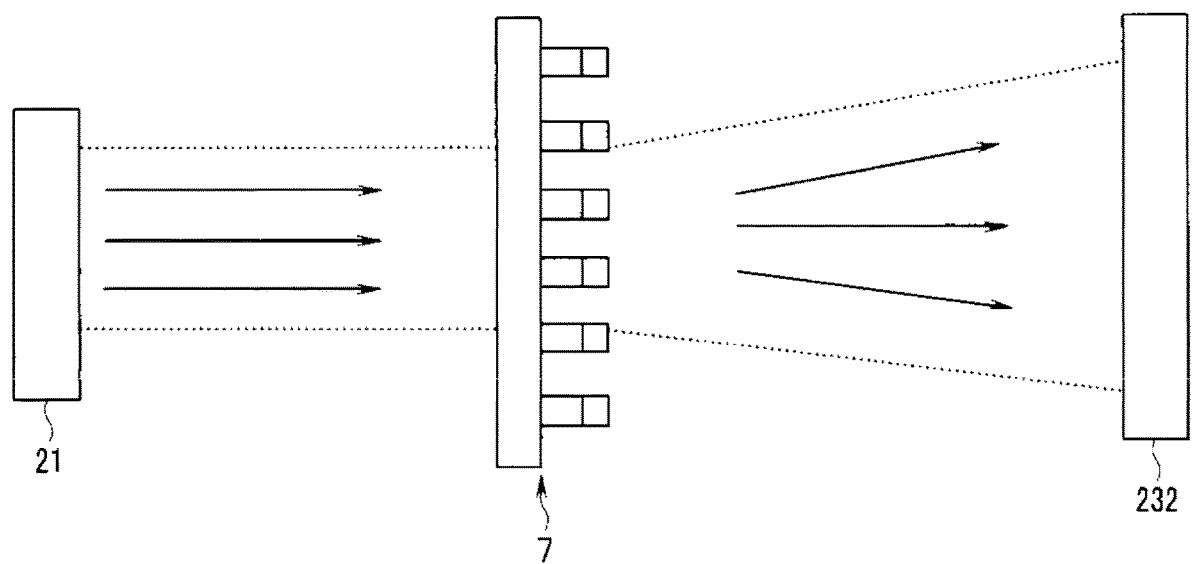
FIG. 3 is a schematic view illustrating an example of a configuration of a T-SAXS measuring device.
Figure 4:
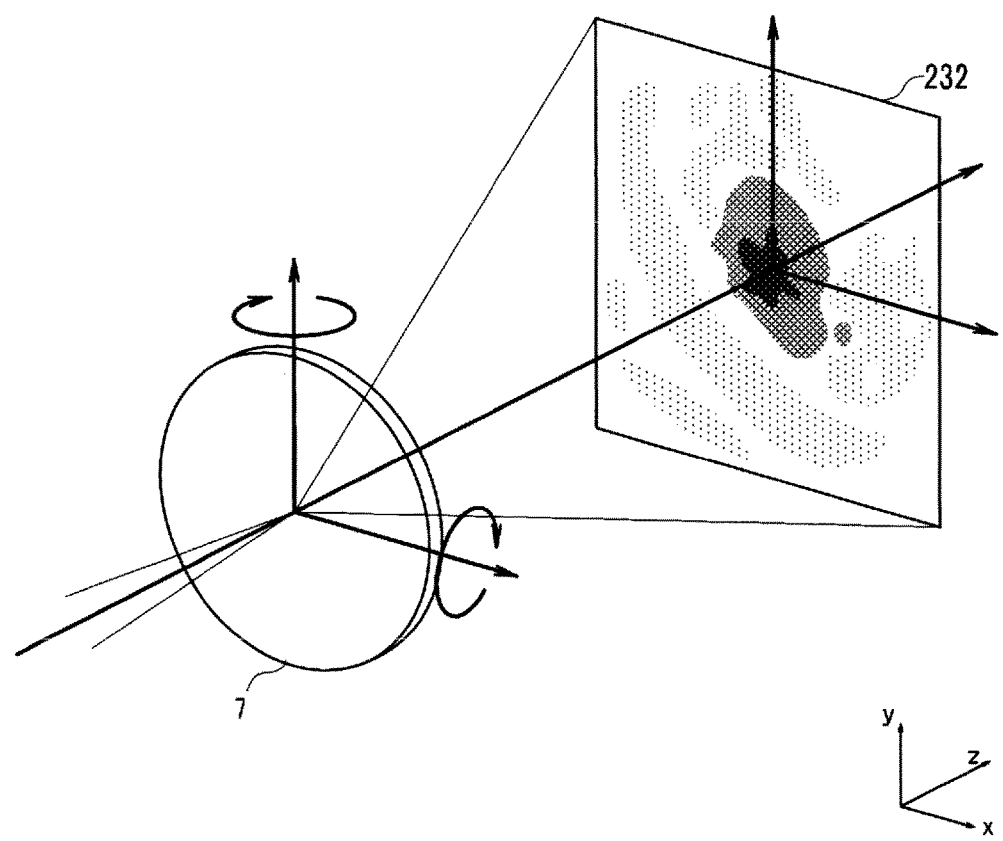
FIG. 4 is a schematic view illustrating an example of a configuration of a T-SAXS measuring device.

FIG. 2 to FIG. 4 are schematic views illustrating examples of the configuration of the T-SAXS measuring device. As illustrated in FIG. 2, the T-SAXS measuring device 2 converges the X-rays emitted from an X-ray source 211 on a beam spot using an X-ray focusing mechanism 213, and the front surface of the subject 7 (semiconductor substrate with periodic patterns such as holes or grooves formed on the front surface) held in the measuring stage 22 is irradiated with the X-rays.

As illustrated in FIG. 3, the X-rays irradiated to the subject 7 are scattered by the pattern formed on the front surface of the subject 7. The scattered X-rays are converted into a signal (diffraction image) indicating the characteristics of the subject 7 by a detector 232.

As illustrated in FIG. 4, the subject 7 is rotatably provided with one or both of two orthogonal directions (x-direction and y-direction) parallel to the front surface of the subject 7 as a rotating shaft. The front surface of the subject 7 refers to the front surface of the semiconductor substrate constituting the subject 7. The incident angle θi of the X-rays with respect to the subject 7 can be adjusted by causing the subject 7 to be irradiated with the X-rays in a state of being rotated around the set rotating shaft. The T-SAXS measuring device 2 acquires a plurality of diffraction images (diffraction image group) while gradually changing the incident angle θi. FIG. 5 is a diagram illustrating a relationship between the incident angle of X-rays and the diffraction image. The acquired diffraction image group is compared with a plurality of diffraction image groups whose intensity distributions of X-ray diffracted light corresponding to various three-dimensional shape patterns are calculated by simulation. A diffraction image group having a high degree of coincidence is extracted from the plurality of diffraction image groups, and the three-dimensional shape pattern corresponding to the diffraction image group is presumed to be a pattern formed on the front surface of the subject 7.

Figure 6:
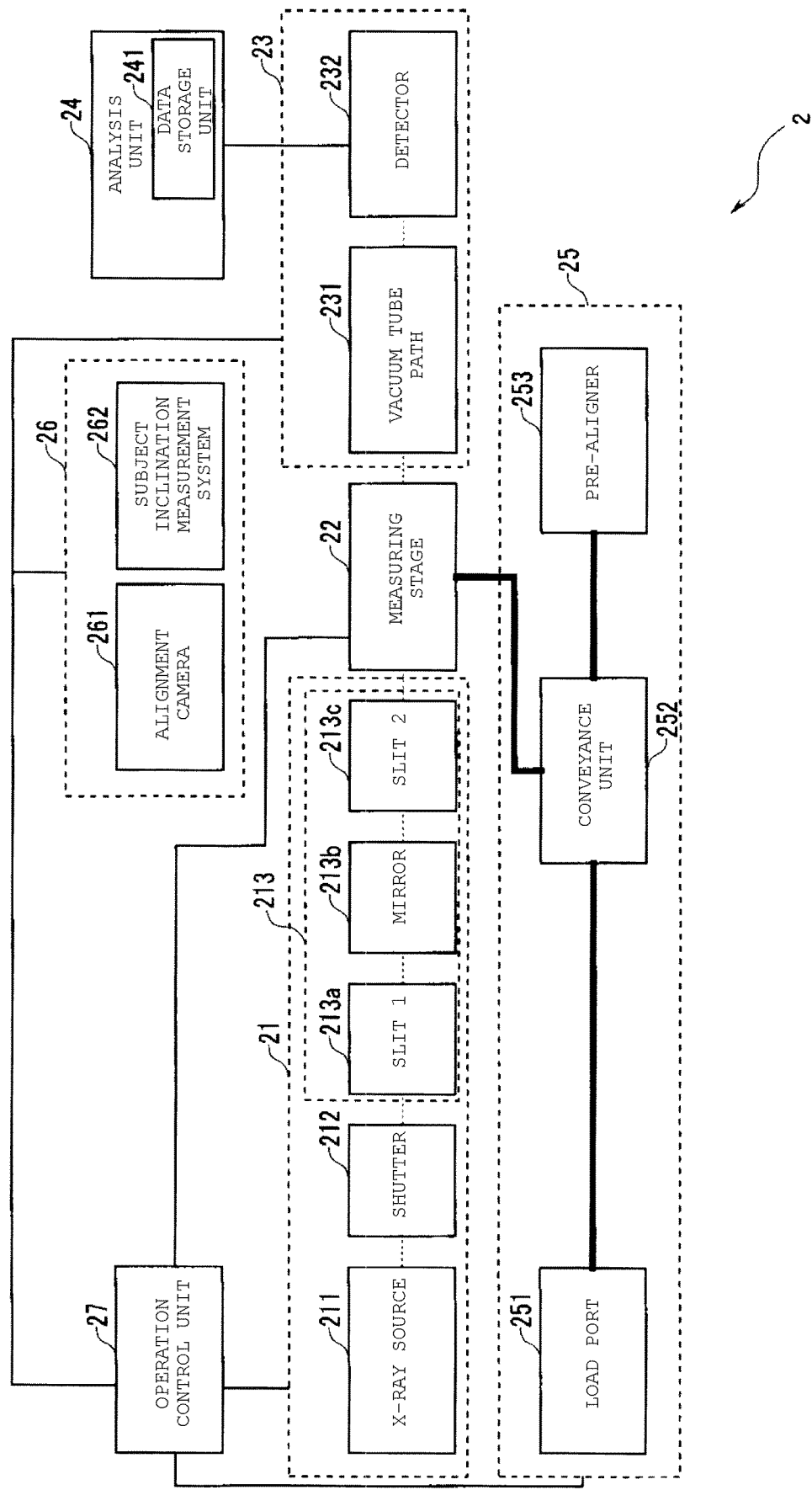
FIG. 6 is a block diagram illustrating an example of a configuration of a T-SAXS measuring device.

FIG. 6 is a schematic block diagram illustrating an example of a configuration of the T-SAXS measuring device. The T-SAXS measuring device 2 includes an X-ray irradiation unit (X-ray irradiator) 21, a measuring stage 22, an X-ray detection unit (detector) 23, and an analysis unit (analyzer) 24. In addition, the T-SAXS measuring device 2 further includes a conveyance unit 25, a position measuring unit 26, and an operation control unit (controller) 27. In FIG. 6, thick lines indicate a conveyance path of the subject 7. Dotted lines indicate the optical path of the irradiation light and the diffracted light. The solid lines indicate a signal transmission path for transmitting data and information (electrical signal).

The X-ray irradiation unit 21 is configured with an X-ray source 211, a shutter 212, and an X-ray focusing mechanism 213. The X-ray source 211 is a portion that generates X-rays having a predetermined wavelength and energy. The X-ray source 211 is configured as, for example, an electron beam source configured to excite the X-rays by irradiating a solid or liquid target with particles. The shutter 212 is provided between the measuring stage 22 and the X-ray source 211. The shutter 212 can be opened and closed, and is controlled by the operation control unit 27. When the shutter 212 is in the open state, the measuring stage 22 is irradiated with X-rays emitted from the X-ray source 211. When the shutter 212 is closed, since the X-ray optical path is blocked, the measuring stage 22 is not irradiated with the X-rays.

The X-ray focusing mechanism 213 is configured with a first slit 213a, a mirror 213b, and a second slit 213c. The X-ray focusing mechanism 213 is provided between the shutter 212 and the measuring stage 22. The first slit 213a is used to limit an angular spread of the emitted X-rays. The mirror 213b converges the emitted X-rays and reduces the beam size. The second slit 213c is disposed close to the measuring stage 22 to further narrow down the beam size of the emitted X-rays. That is, the X-ray focusing mechanism 213 prevents the subject from be irradiated with the scattered rays of emitted X-rays and narrows, down the irradiation range of the X-rays to the subject 7. The imaging area of the subject 7 provided in the measuring stage 22 is irradiated with the X-rays narrowed down by the X-ray focusing mechanism 213.

The measuring stage 22 is a member that rotatably supports the subject 7 with the x-direction and/or y-direction as a rotating shaft. The measuring stage 22 is configured with, for example, a support shaft configured with a tubular or a rod-shaped member, and a chuck which is a hollow ring-shaped member. The chuck is rotatably engaged with one end of the support shaft.

In addition, the measuring stage 22 is configured to move in the x-direction and/or y-direction by a drive section such as a motor (not illustrated), and to move in the direction (z-direction) orthogonal to the x-direction and y-direction. By moving the measuring stage 22 in the x-direction and/or y-direction, the imaging area 7a, which is a range of the subject 7 irradiated with the X-ray, can be moved. In addition, by moving the measuring stage 22 in the z-direction, the focus of the diffraction image of the subject 7 detected by the X-ray detection unit 23 can be changed. In a state where the subject 7 is held in the chuck, the support shaft and the measuring stage are configured to operate by a drive section such as a motor (not illustrated) such that the center of rotation of the subject 7 and an axis perpendicular to the front surface of a wafer at the measurement point are aligned with each other.

An X-ray detection unit 23 is configured with a vacuum tube path 231 and a detector 232. The vacuum tube path 231 is a columnar shape member whose inside is evacuated, and is disposed between the measuring stage 22 and the detector 232. The diffracted X-rays generated from the subject 7 placed on the measuring stage 22 are incident on the vacuum tube path 231 from one end surface of the vacuum tube path 231, pass through the vacuum tube path 231, and are emitted out toward the detector 232 from the other end surface of the vacuum tube path 231. The vacuum tube path 231 prevents the diffracted X-rays from being affected by a disturbance caused by the environment (air disturbance or the like) and the noise being superimposed on the diffraction image.

The detector 232 receives the diffracted X-rays generated from the subject 7 and generates a diffraction image. For example, the detector 232 is configured with a plurality of semiconductor detection elements (solid-state imaging devices, and the like) arranged in a two-dimensional array shape. As the semiconductor detection elements, for example, a CCD (charge coupling element) or a CMOS image sensor is used. The diffracted X-rays generated by the irradiation X-rays in the imaging area of the subject 7 are photo-electrically converted by semiconductor detection elements disposed in the projection area of the detector 232 and are output as an image signal (diffraction image).

The analysis unit 24 compares the diffraction image group (a plurality of diffraction images acquired by changing the rotation angle of the subject 7) output from the detector 232 with the diffraction image group of which the intensity distribution of X-ray diffracted light corresponding to various three-dimensional shape patterns is calculated in advance by the simulation. A diffraction image group having a high degree of coincidence is extracted from the plurality of diffraction image groups, and the three-dimensional shape pattern corresponding to the diffraction image group is presumed to be a pattern formed on the front surface of the subject 7. In addition, it is also possible to acquire the measurement data measured by a multi-wavelength measuring device 3 via a host computer 4 and determine the three-dimensional shape pattern using the measurement data.

The conveyance unit (conveyor) 25 includes a load port 251, a conveyance unit 252, and a pre-aligner 253. The load port 251 is an inlet portion provided for inserting the subject 7 into the T-SAXS measuring device 2. The conveyance unit 252 is a portion that automatically conveys the subject 7 to each portion in the T-SAXS measuring device 2. When the subject 7 is provided on the measuring stage 22, the pre-aligner 253 aligns a reference position (for example, a notch, an oriental flat, for example) provided in the subject 7 to a desired position.

When subject 7 is set on the measuring stage 22 of the T-SAXS measuring device 2, the conveyance unit 25 operates as follows. When a container containing the subject 7 is provided in the load port 251, the conveyance unit 252 picks up the subject 7 from the container and moves the subject 7 to the pre-aligner 253. After the pre-aligner 253 performs the alignment of the subject 7 in the x-direction and the y-direction and performs the alignment of the subject 7 in the rotational direction with the center of the subject 7 as an axis in the xy-plane, the conveyance unit 252 picks up the subject 7 again and places the subject 7 on the measuring stage 22. In addition, when the acquisition of the diffraction image group is completed and the subject 7 is taken out from the T-SAXS measuring device 2, the conveyance unit 252 picks up the subject 7 from the measuring stage 22 and moves the subject 7 into the container provided at the load port 251. The operation of the conveyance unit 25 described above is controlled by the operation control unit 27.

The position measuring unit 26 includes an alignment camera 261 and a subject inclination measurement unit 262. The alignment camera 261 measures an amount of deviation (the amount of deviation on the xy-plane) between the irradiation position on the measuring stage 22 of the X-rays emitted from the X-ray irradiation unit 21 and the measurement target position on the subject 7. The measured amount of deviation is output to the operation control unit 27. The subject inclination measurement unit 262 measures the angle of the front surface at the measurement position of the subject 7 provided on the measuring stage 22.

The operation control unit 27 controls the operation of each portion of the T-SAXS measuring device 2. The operation control unit 27 gives an instruction, for example, to the X-ray irradiation unit 21 and the X-ray detection unit 23 for the parameters, instruction for the rotation angle and the rotation direction of the measuring stage 22, and instruction for the instruction of the conveyance unit 25.

The multi-wavelength light measuring device 3 is a device that measures a film structure (film thickness) and the three-dimensional shape of the periodic pattern formed on the front surface of the subject. The subject is irradiated with multi-wavelength light included in a predetermined wavelength band at a predetermined incident angle, and the reflection intensity of the diffracted light or the spectral characteristics of the phase difference between different polarization conditions is acquired. Using the spectral characteristics of the diffracted light, it is possible to measure the film structure (particularly, the film thickness of the film formed on the outermost front surface) of the periodic pattern formed within the spot size of the irradiation light and the three-dimensional shape. The multi-wavelength light measuring device 3 performs the measurement using the light having a wavelength longer than that of the T-SAXS measuring device 2. Therefore, although the accuracy of the measurement of the three-dimensional shape is inferior to that of the T-SAXS measuring device 2, a plurality of films having a small electron density difference (for example, a silicon substrate and a silicon oxide film, an amorphous carbon film or a silicon oxide film, for example) can be individually identified.

Figure 7:
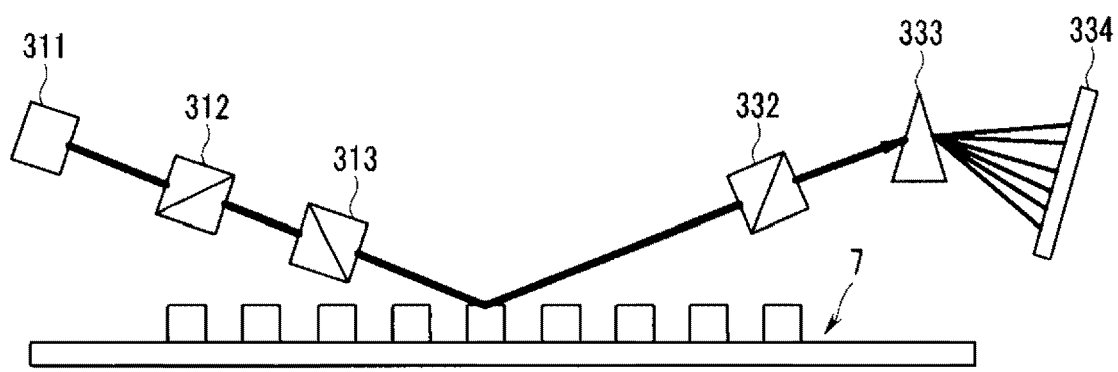
FIG. 7 is a schematic view illustrating an example of a configuration of a multi-wavelength light measuring device.
Figure 8:
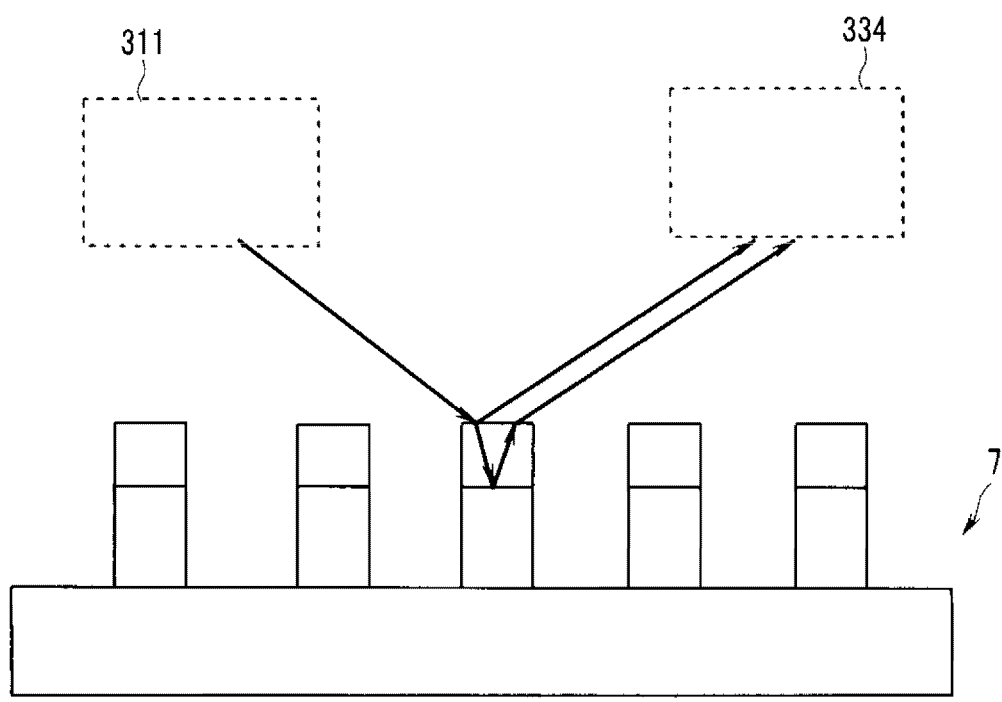
FIG. 8 is a schematic view illustrating an example of a configuration of a multi-wavelength light measuring device.

FIG. 7 and FIG. 8 are schematic views illustrating examples of a configuration of a multi-wavelength light measuring device. FIG. 7 shows a measuring device using an OCD (Optical Critical Dimension) method as an example of the multi-wavelength light measuring device 3. The OCD method is also referred to as scatterometry. The multi-wavelength light measuring device using the OCD method performs the measurement using, for example, multi-wavelength light (wavelength of approximately 190 nm to 2200 nm) having a spot size of approximately 40 µm square.

As illustrated in FIG. 7, the multi-wavelength light measuring device 3 adjusts a deflection state of the multi-wavelength light (for example, white light) emitted from a multi-wavelength light source 311 using a polarizer (deflector) 312 and a compensator (compensator) 313, and the front surface of the subject 7 is irradiated. As illustrated in FIG. 8, the deflection state and the reflection intensity of the multi-wavelength light irradiated to the subject 7 are changed for each wavelength depending on the film structure of the pattern formed on the front surface of the subject 7. The multi-wavelength light reflected from the subject 7 is wavelength-decomposed by a prism 333 after the deflection state is adjusted by the analyzer (photonometer) 332. The multi-wavelength light that was wavelength-decomposed is converted into a signal (diffracted light intensity spectrum) indicating the characteristics of the subject 7 by the detector 334.

The multi-wavelength light measuring device 3 has two methods of measuring: a method in which the multi-wavelength light is obliquely incident for measuring the change in the deflection state (a spectroscopic ellipsometry) as illustrated in FIG. 8, and a method in which the multi-wavelength light is vertically incident for measuring the change of the reflection intensity (spectroscopic reflectometry). A method that is suitable for the front surface pattern formed on the subject 7 may be used.

Diffracted light intensity spectra corresponding to various three-dimensional shape patterns and film structures are calculated by simulation using the RCWA (Rigorous Couple-Wave Analysis) method, and a spectral characteristic library is created. The acquired diffracted light intensity spectrum is compared with the spectral characteristic library, and a spectrum having a high degree of coincidence is extracted. The three-dimensional shape pattern and film structure corresponding to the extracted spectrum are presumed to be the pattern and film structure formed on the front surface of subject 7.

Figure 9:
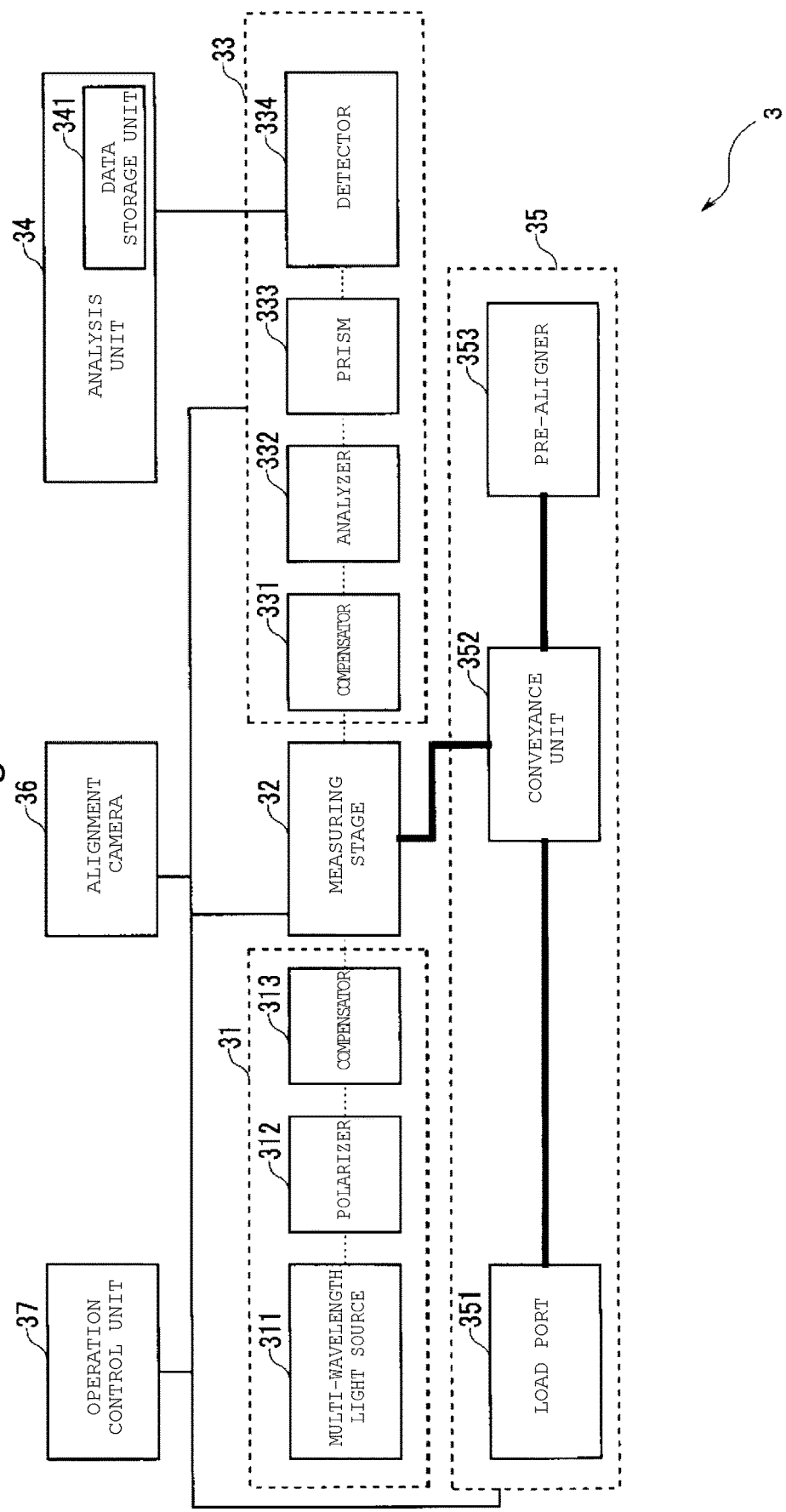
FIG. 9 is a schematic block diagram illustrating an example of a configuration of a multi-wavelength light measuring device.

FIG. 9 is a schematic block diagram illustrating an example of a configuration of the multi-wavelength light measuring device. The multi-wavelength light measuring device 3 includes a multi-wavelength light irradiation unit 31, a measuring stage 32, a multi-wavelength light detection unit 33, and an analysis unit 34. In addition, the multi-wavelength light measuring device 3 also includes a conveyance unit 35, an alignment camera 36, and an operation control unit 37. In FIG. 9, the thick line indicates the conveyance path of subject 7. Dotted lines indicate the optical path of the irradiation light and the diffracted light. The solid lines indicate a signal transmission path for transmitting data and information (electrical signal).

The multi-wavelength light irradiation unit 31 includes a multi-wavelength light source 311, a polarizer 312, and a compensator 313. As the multi-wavelength light source 311, a white light source capable of emitting light of a wavelength band of approximately 190 nm to 2200 nm, such as a xenon lamp or a halogen lamp, is used. The polarizer (deflector) 312 converts the irradiation light into straight line deflection. The compensator (compensator) 313 adjusts the deflection state of the irradiation light. The imaging area of the subject 7 provided on the measuring stage 32 is irradiated with the irradiation light of which the deflection state is adjusted.

The measuring stage 32 can be moved in two orthogonal directions (x-direction and y-direction) parallel to the front surface of the measuring stage 32 by a drive section such as a motor (not illustrated). By moving the measuring stage 32 in the x-direction and/or the y-direction, a desired position can be measured. In addition, the measuring stage 32 can also be moved in a direction (z-direction) orthogonal to the front surface of the measuring stage 32.

The multi-wavelength light detection unit 33 includes a compensator 331, an analyzer 332, a prism 333, and a detector 334. The compensator (compensator) 331 adjusts the deflection state of the diffracted light generated from the subject 7 placed on the measuring stage 32. The prism 333 disperses the transmitted diffracted light according to the wavelength. The detector 334 receives the diffracted light dispersed by the prism 333 and generates a signal according to the amount of light. The detector 334 is configured with, for example, a plurality of semiconductor detection elements (solid-state imaging device, for example) arranged in a two-dimensional array. As the semiconductor detection elements, for example, a CCD (charge coupling element) or a CMOS image sensor is used. The diffracted light generated by the multi-wavelength light in the imaging area of the subject 7 is photo-electrically converted by the semiconductor detection elements disposed in the projection area of the detector 334, and is output as an image signal (diffracted light intensity spectrum).

The analysis unit 34 compares the spectral characteristic library in which the diffracted light intensity spectra corresponding to various three-dimensional shape patterns and film structures are calculated by the simulation using the RCWA method, with the diffracted light intensity spectrum output from the detector 334. The spectral characteristic library is stored in advance in a data storage unit 341 provided in the analysis unit 34. The diffracted light intensity spectrum having a high degree of coincidence is extracted from the spectral characteristic library, and the film structure and the three-dimensional shape pattern corresponding to the diffracted light intensity spectrum are presumed to be a pattern formed on the front surface of the subject 7.

The conveyance unit 35 has the same configuration as the conveyance unit 25 of the T-SAXS measuring device 2 illustrated in FIG. 6. In addition, the alignment camera 36 also has the same configuration as the alignment camera 261 of the T-SAXS measuring device 2. The operation control unit 37 controls the operation of each portion of the multi-wavelength light measuring device 3. For example, the operation control unit gives instructions for the parameters of the multi-wavelength light irradiation unit 31 and the multi-wavelength light detection unit 33, and instructions for the operations of the measuring stage 32 and the conveyance unit 35.

The multi-wavelength light measuring device 3 is not limited to use the measuring device using the optical critical dimension (OCD) method described above, and for example, may use a measuring device using the Fourier Transform InfraRed (FT-IR) method in which the multi-wavelength light in the infrared wavelength band is used as the irradiation light.

Figure 10:
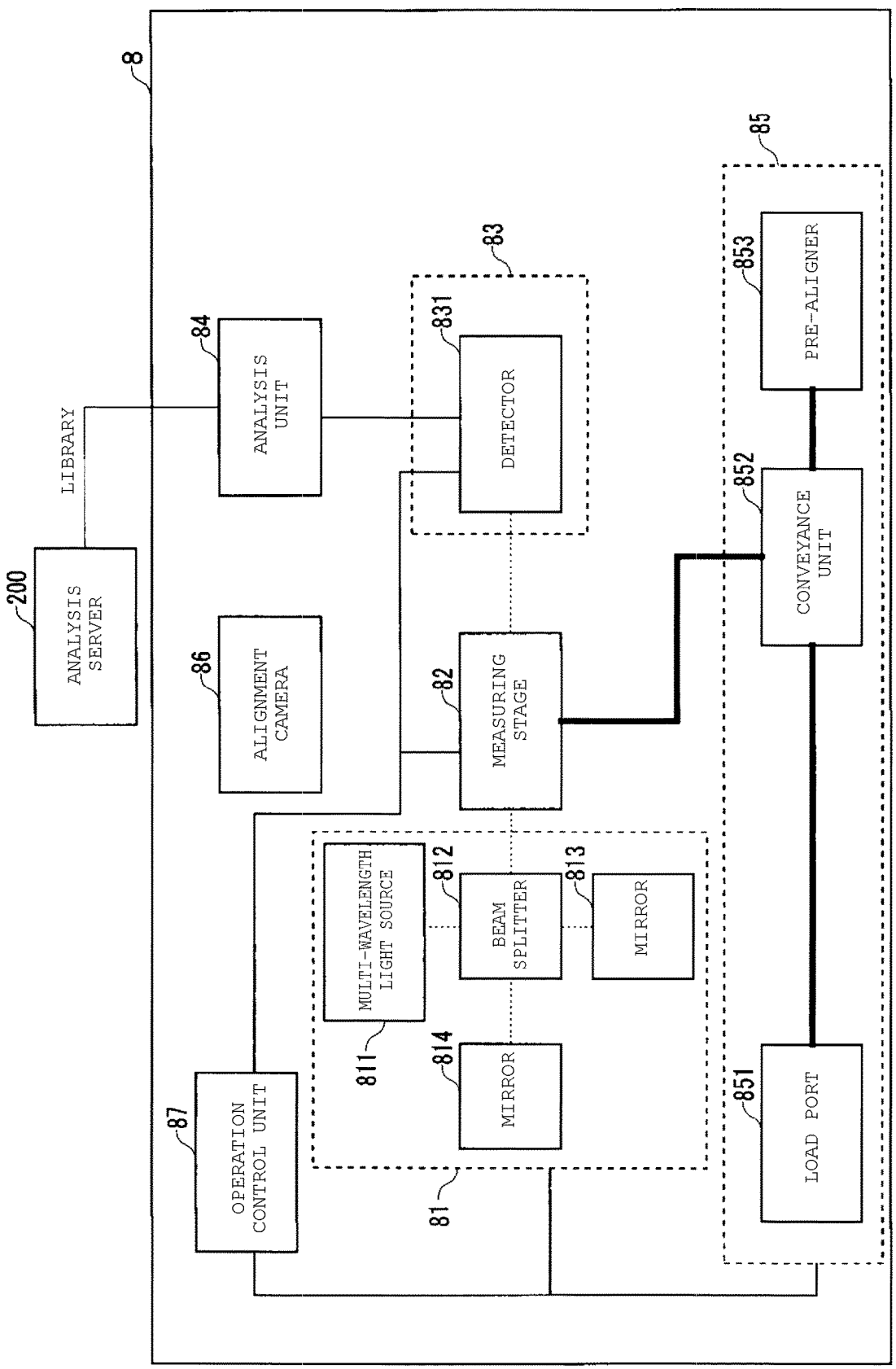
FIG. 10 is a schematic block diagram illustrating another example of a configuration of a multi-wavelength light measuring device.

FIG. 10 is a schematic block diagram illustrating another example of a configuration of the multi-wavelength light measuring device. That is, an example of a configuration of a multi-wavelength light measuring device 8 using the FT-IR method is illustrated. In the multi-wavelength light measuring device 8, the configuration of the multi-wavelength light irradiation unit 81 and the configuration of the multi-wavelength light detection unit 83 are different from those in the multi-wavelength light measuring device 3 illustrated in FIG. 9. The configurations of other units are the same as those of the multi-wavelength light measuring device 3.

The multi-wavelength light irradiation unit 81 includes a multi-wavelength light source 811, a beam splitter 812, and two mirrors 813 and 814. As the multi-wavelength light source 811, a light source capable of emitting light (infrared light) having a spot size approximately 200 nm×800 nm and having a wavelength band of approximately 1 μm to 20 μm, such as a SiC+halogen lamp, a silicon nitride global light source, or the like, is used. The beam splitter 812 splits the infrared light emitted from the multi-wavelength light source 811 in two directions. The beam splitter 812 is provided such that the irradiation light is incident on a reflective layer (not illustrated) configuring the beam splitter 812 at an angle of 45 degrees. A light flux (first light flux) that is part of the irradiation light is reflected by the reflective layer, and the remaining light flux (second light flux) transmits through the reflective layer.

The mirrors 813 and 814 are provided such that the light fluxes in the two directions separated by the beam splitter 812 are vertically incident. In addition, the mirror 814 has a variable distance from the beam splitter 812. The second light flux transmitted through the reflective layer is incident on the mirror 813, and the first light flux reflected by the reflective layer is incident on the mirror 814. The mirrors 813 and 814 totally reflect the incident light flux. The second light flux reflected by the mirror 813 is incident on the reflective layer of the beam splitter 812 at an angle of 45 degrees and is reflected from the reflective layer. The first light flux reflected by the mirror 814 transmits through the reflective layer. The second light flux reflected by the mirror 813 and further reflected from the reflective layer and the first light flux reflected by the mirror 814 and transmitted through the reflective layer have the same optical axis and interfere with each other to be composed to the irradiation light of a predetermined wavelength. Here, when a distance between the mirror 814 and the beam splitter 812 is changed, a phase difference between a phase of the second light flux and a phase of the first light flux is changed. In this way, the wavelength of the light composed by the interference of the first light flux and the second light flux can be adjusted. The infrared light of which the wavelength is adjusted is incident on the subject 7.

The multi-wavelength light detection unit 83 is configured with only the detector 831 having the same configuration as the detector 334 in the multi-wavelength light detection unit 33 of the multi-wavelength light measuring device 3 illustrated in FIG. 9, and does not include the compensator 331, the analyzer 332, and the prism 333.

That is, the multi-wavelength light measuring device 3 using the OCD method illustrated in FIG. 9 disperses the diffracted light having a predetermined wavelength band generated from the subject 7 by the prism 333, and detects the diffracted light intensity spectra of multiple wavelengths are detected at the same timing. On the other hand, the multi-wavelength light measuring device 8 using the FT-IR method illustrated in FIG. 10 changes the wavelength of the irradiation light with which the subject 7 is irradiated, while changing the distance between the mirror 814 and the beam splitter 812, the diffracted light intensity spectra having the different wavelengths are measured in time division.

Since the multi-wavelength light measuring device 8 using the FT-IR method has a longer wavelength of irradiation light compared to the multi-wavelength measuring device 3 using the OCD method, complicated diffracted light due to the front surface pattern of the subject 7 is not generated. Therefore, the analysis unit 84 can use a spectral characteristic library calculated by simulation using an effective medium approximation (EMA) method, which requires less calculation than the RCWA method. In the case of the simulation using the EMA method, the spectral characteristic library can be calculated by the external analysis server 200 in parallel with the measurement of the diffracted light intensity spectrum. Therefore, the analysis unit 84 can acquire the spectral characteristic library calculated by the analysis server 200 without calculating and storing the spectral characteristic library in advance, and can compare the spectral characteristic library with the diffracted light intensity spectrum output from the detector 831.

In addition, since the multi-wavelength light measuring device 8 using the FT-IR method has a longer wavelength of irradiation light as compared to the multi-wavelength measuring device 3 using the OCD method, it is possible to measure a material such as amorphous carbon that is difficult for the light to pass through. Therefore, when a film made of a material that is difficult for the light to pass through is used for the front surface pattern of the subject 7, it is preferable to use a multi-wavelength light measuring device 8 using the FT-IR method.

The host computer 4 includes a central process unit (CPU) and a memory. The host computer 4 inputs the measurement data output from the multi-wavelength light measuring device 3 to the T-SAXS measuring device 2. In addition, it is also possible to presume the film structure and three-dimensional shape pattern of the subject 7 based on the measurement data output from the T-SAXS measuring device 2 and the measurement data output from the multi-wavelength light measuring device 3. The operation of presuming the three-dimensional shape pattern is performed by software, for example, stored in advance in a memory as a program and executing the program in the CPU. In addition, the operation of generating the three-dimensional shape pattern may be performed by one or more processors configured with hardware. For example, it may be a processor configured with an electronic circuit, or it may be a processor configured with an integrated circuit such as a field programmable gate array (FPGA).

The database 5 stores various parameters and data used for presuming the film structure and the three-dimensional shape pattern of the subject 7 generated by the host computer 4, and stores the result of the presuming.

The measurement system 1 in the embodiment described above is used, for example, in an etching process of forming a memory hole of a semiconductor storage device having a memory cell array having a three-dimensional structure. Here, a semiconductor storage device having a memory cell array having a three-dimensional structure will be described with reference to FIG. 11.

Figure 11:
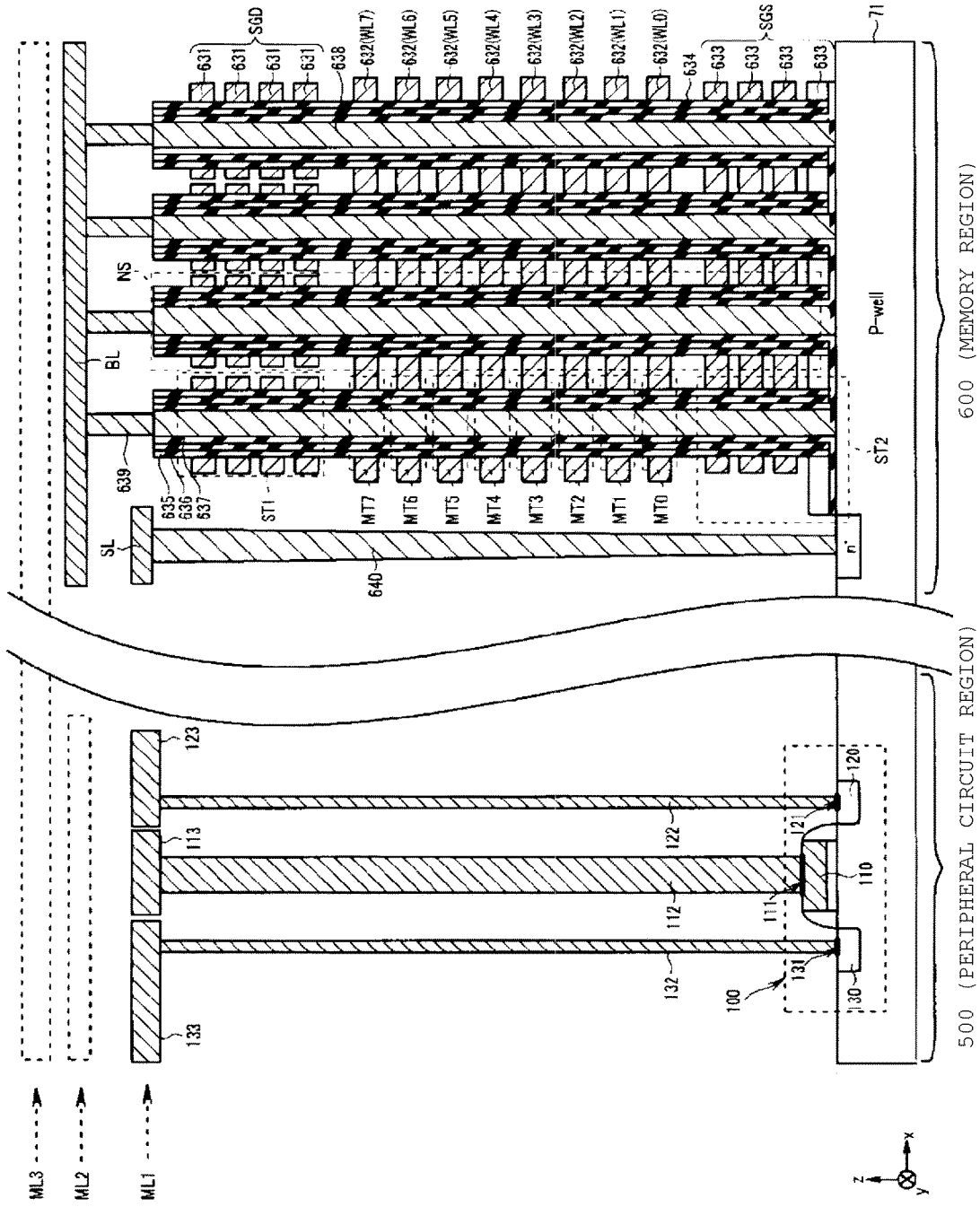
FIG. 11 is a cross-sectional view of a part of region of a semiconductor storage device having a memory cell array of a NAND memory having a three-dimensional structure.

FIG. 11 is a cross-sectional view of a part of region of a semiconductor storage device having a memory cell array of a NAND memory having a three-dimensional structure. For example, the semiconductor storage device functions as the subject 7. More specifically, for example, a semiconductor wafer for manufacturing the semiconductor storage device functions as a subject 7. FIG. 11 illustrates apart of region of the memory cell array and the peripheral circuit region. In the description below, the direction in which a bit line BL extends is the x-direction on a plane parallel to the front surface of the semiconductor substrate 71. In addition, the direction parallel to the front surface of the semiconductor substrate 71 and orthogonal to the x-direction is the y-direction. In addition, the direction orthogonal to the front surface of the semiconductor substrate 71 is the z-direction. In at least one embodiment, a memory region 600 in which the memory circuit is formed is provided on the semiconductor substrate, and a peripheral circuit region 500 in which the peripheral circuit is formed is provided on the semiconductor substrate 71 in the periphery of the memory region 600. That is, when viewed from the Z direction, the memory region 600 and the peripheral circuit region 500 are arranged so as not to overlap each other.

As illustrated in FIG. 11, a plurality of NAND strings NS are formed on a p-type well region (P-well). That is, a plurality of wiring layers 633 functioning as a select gate line SGS, a plurality of wiring layers 632 functioning as a word line WLi, and a plurality of wiring layers 631 functioning as a select gate line SGD are stacked on the p-type well region. FIG. 11 illustrates a structure in which the wiring layers 632 that function as a word line WLi is stacked in eight layers, but in the memory cell array of the semiconductor storage device, more layers such as 48 layers, 64 layers, 96 layers, and more layers of wiring layer 632 may be stacked.

Then, a memory hole 634 that penetrates these wiring layers 633, 632, and 631 and reaches the p-type well region, is formed. A block insulating film 635, a charge storage film 636, and a gate insulating film 637 are sequentially formed on the side surface of the memory hole 634, and further, a conductor column 638 is embedded in the memory hole 634. The conductor column 638 is made of polysilicon, for example, and functions as a region where channels are formed during the operation of the memory cell transistor MT in the NAND string NS and the select transistors ST1 and ST2.

In each NAND string NS, the select transistor ST2, a plurality of memory cell transistors MT, and the select transistor ST1 are formed on the p-type well region. A wiring layer that functions as a bit line BL is formed above the conductor column 638. A contact plug 639 for connecting the conductor column 638 and the bit line BL is formed at the upper end of the conductor column 638.

Further, an n+ type impurity diffusion layer and a p+ type impurity diffusion layer are formed on the front surface of the p-type well region. A contact plug 640 is formed on the n+ type impurity diffusion layer, and a wiring layer that functions as a source line SL is formed on the contact plug 640.

A plurality of the configurations illustrated in FIG. 11 are arranged in the depth direction (y-direction) of the paper surface of FIG. 11, and one string unit SU is formed by a set of a plurality of NAND strings arranged in a row in the depth direction.

On the other hand, in the peripheral circuit region 500, the circuit such as an input output circuit in the peripheral circuit is formed. For example, the input output circuit described above has a configuration in which logical gates such as inverters are combined in multiple stages. Therefore, a large number of MOS transistors forming a logic gate are formed in the peripheral circuit region 500. This large number of these MOS transistors are formed on the semiconductor substrate 71 in the peripheral circuit region 500. FIG. 11 illustrates one of these MOS transistors. FIG. 11 schematically illustrates the cross-sectional structure of the nonvolatile memory, and the size of the MOS transistor 100 illustrated in FIG. 11 and the ratio between the elements configuring the MOS transistor 101 are different from the actual size and the ratio.

In the MOS transistor 100 configuring the peripheral circuit, a gate wiring 110 is formed on the semiconductor substrate 71 via the gate insulating film. The gate wiring 110 may be, for example, a polysilicon film into which impurities suitable for the operation of the MOS transistor are injected. In the semiconductor substrate on the right and left sides of the gate wiring 110 in the X direction, a drain region 120 and a source region 130 are formed. For example, when the MOS transistor 100 is an n-type MOS transistor (NMOS transistor), impurities such as arsenic (As) and phosphorus (P) are injected into the semiconductor substrate 71 in the drain region 120 and the source region 130, for example, and are diffused to a predetermined depth.

A metal wiring 113 for supplying an electric potential to the gate wiring 110 is formed on the upper layer of the gate wiring 110 via an insulating layer. A gate electrode 111 as a contact region is formed on the gate wiring 110. A contact plug 112 for electrically connecting the metal wiring 113 and the gate electrode 111 is formed on the upper layer of the gate electrode 111. That is, the electric potential of the metal wiring 113 is supplied from the gate electrode 111 to the gate wiring 110 via the contact plug 112.

A metal wiring 123 for supplying the electric potential to the drain region 120 is formed on the upper layer of the drain region 120 via the insulating layer. A drain electrode 121 as a contact region is formed on the drain region 120. A contact plug 122 for electrically connecting the metal wiring 123 and the drain electrode 121 is formed on the upper layer of the drain electrode 121. That is, the electric potential of the metal wiring 123 is supplied from the drain electrode 121 to the drain region 120 via the contact plug 122.

A metal wiring 133 for supplying the electric potential to the source region 130 is formed on the upper layer of the source region 130 via the insulating layer. A source electrode 131 as a contact region is formed on the source region 130. A contact plug 132 for electrically connecting the metal wiring 133 and the source electrode 131 is formed on the upper layer of the source electrode 131. That is, the electric potential of the metal wiring 133 is supplied from the source electrode 131 to the source region 130 via the contact plug 132.

Such as a bit line BL, a wiring layer formed of a metal material, the source line SL, and the metal wirings 131 to 133 are formed on the upper layer of the NAND string NS after being formed. Usually, a wiring layer formed of a metal material is formed with a plurality of layers with sandwiching the insulating films. In the example in FIG. 11, a case where three wiring layers of ML1, ML2, and ML3 are provided is illustrated. The bit line BL, the source line SL, and the metal wirings 131 to 133 are formed on one or more layers of those wiring layers. For example, FIG. 11 illustrates a case where the metal wirings 131 to 133 and the source line SL are formed on the wiring layer ML1 which is the first layer from the bottom, and the bit line BL is formed on the wiring layer ML2 which is the second layer from the bottom. For example, a wiring for transmitting the power supply voltage is formed on the uppermost wiring layer ML3.

Figure 12:
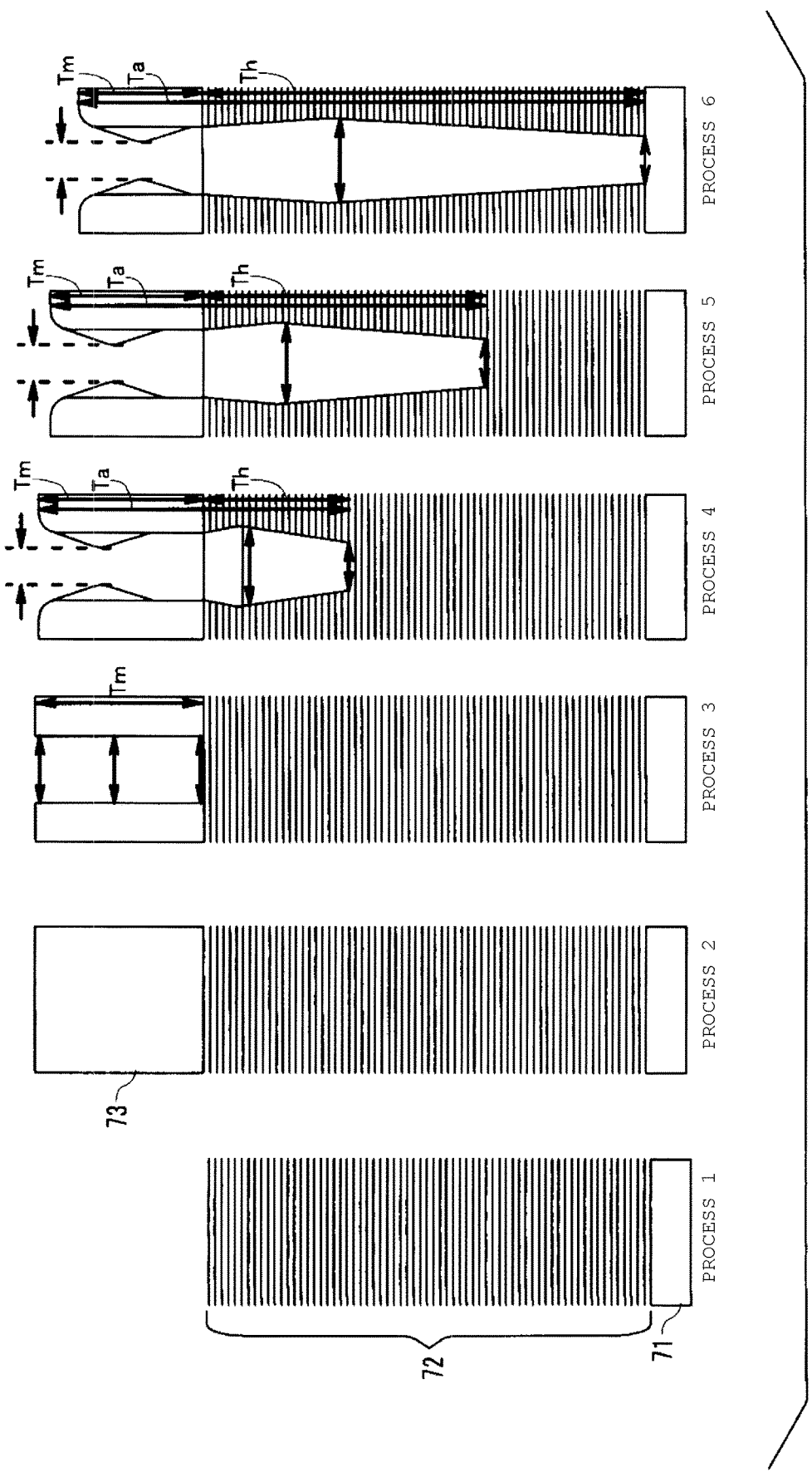
FIG. 12 is a schematic cross-sectional view illustrating a process of forming a memory hole.

Next, a method of forming the memory hole 634 in the semiconductor storage device having the structure as illustrated in FIG. 11 will be described with reference to FIG. 12. FIG. 12 is a schematic cross-sectional view illustrating a process of forming the memory hole. The memory hole 634 is formed, for example, through a plurality of processes. FIG. illustrates cross-sectional views of a plurality of processes for forming the memory hole 634 side by side from left to right in a chronological order.

First, in the first process (process 1), a silicon oxide film and a silicon nitride film are alternately deposited on the semiconductor substrate 71, an ON stack film 72 is formed on the entire surface of the front surface of the semiconductor substrate 71. In FIG. 12, the solid line corresponds to the silicon nitride film, and the blank adjacent to the solid line corresponds to the silicon oxide film. The silicon nitride film in the ON stack film 72 is replaced with a conductive band film (for example, a tungsten film) in a later process to become the wiring layer 631, the wiring layer 632, and the wiring layer 633. The silicon oxide film in the ON stack film 72 serves as an insulating film between the wiring layers described above.

In the subsequent process (process 2), an etching mask film 73 is deposited on the front surface of the ON stack film 72. As the etching mask film 73, for example, an amorphous carbon film for example is used. Then, in the next process (process 3), the etching mask film 73 positioned in the region where the memory hole is formed is removed, and an opening is formed on the etching mask film 73.

In the subsequent processes (process 4 to process 6), the ON stack film 72 formed in the lower portion of the opening of the etching mask film 73 is removed by dry etching using the etching mask film 73 as a mask. The memory hole 634 is, for example, a hole having a high aspect ratio with a diameter of approximately 100 nm and a depth of several μm. Therefore, in the process of forming the memory hole 634, the optimum etching conditions may change. Therefore, in the process of forming the memory hole 634, the etching conditions are changed in a plurality of stages. For example, at the end of each predetermined stage, the etching is temporarily interrupted, and the hole processing state (the remaining film thickness of the etching mask film 73, the etching depth of the ON stack film 72, the cross-sectional shape, for example) is measured. Then, the etching conditions are adjusted according to the measured processing state, and the etching of the next stage is performed. In FIG. 12, the cross section at the end of a certain stage is illustrated in process 4, and the cross section at the end of the stage subsequent to process 4 is illustrated as process 5. In etching for forming a memory hole, the more "stages" for measuring the processing state and adjusting the etching conditions may be defined. Every time each stage is completed, the processing state is measured and fed back to the adjustment of the etching conditions in the next stage. In addition, depending on the measurement result of the processing state, the etching condition in the next stage may not be changed.

In FIG. 12, the cross section at the end of the stage subsequent to process 5 is illustrated as process 6. The process 6 entirely removes the ON stack film 72 formed in the lower portion of the opening of the etching mask film 73, and completes the formation of the memory hole. In FIG. 12, the remaining film thickness of the etching mask film 73 is indicated as Tm, the etching depth of the ON stack film 72 is indicated as Th, and the depth from the front surface of the etching mask film 73 to the bottom of the processed hole is indicated as Ta. That is, there is a relationship of Tm+Th=Ta.

Figure 13:
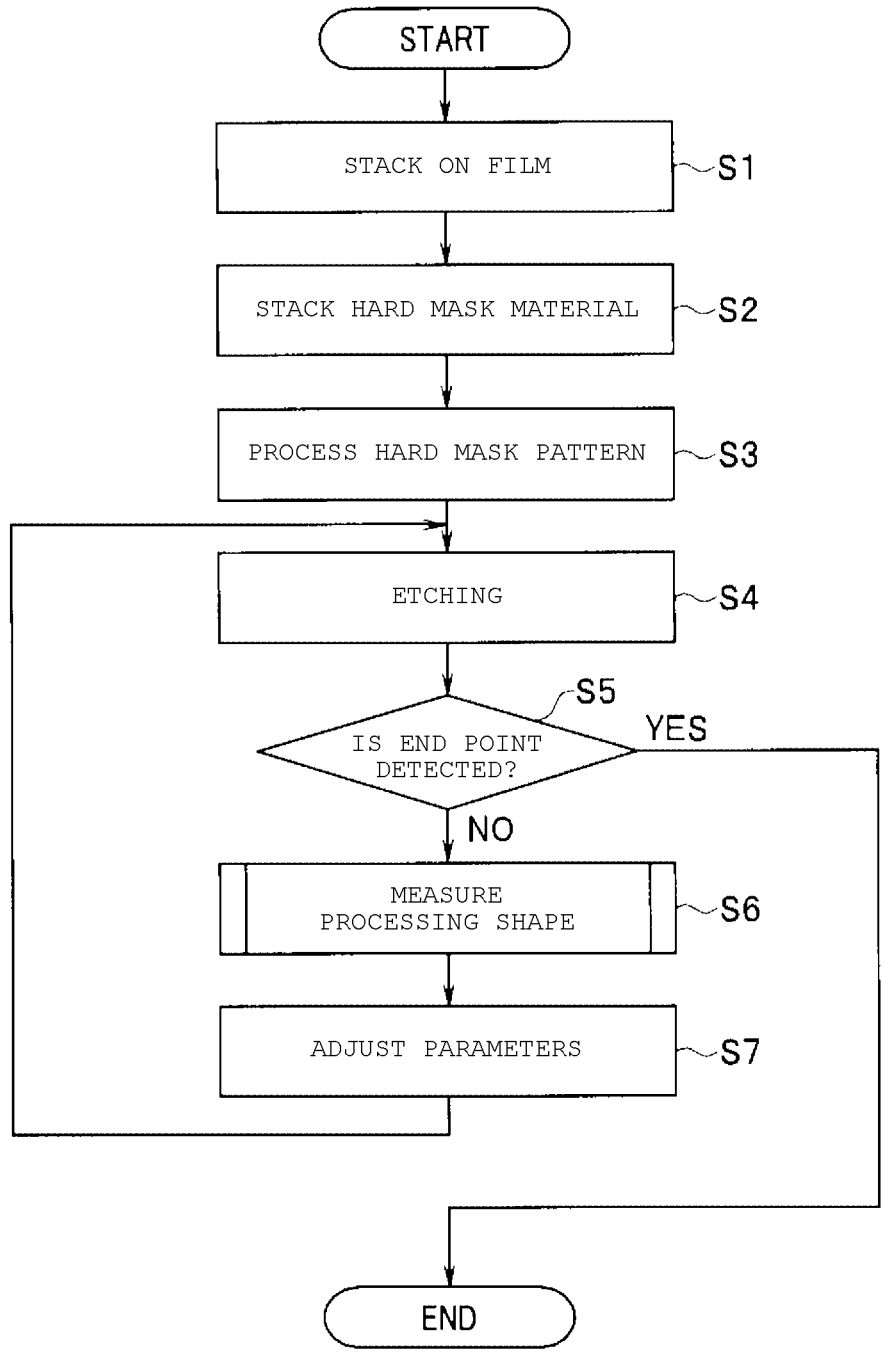
FIG. 13 is a flowchart illustrating an example of a procedure for forming a memory hole.
Figure 14:
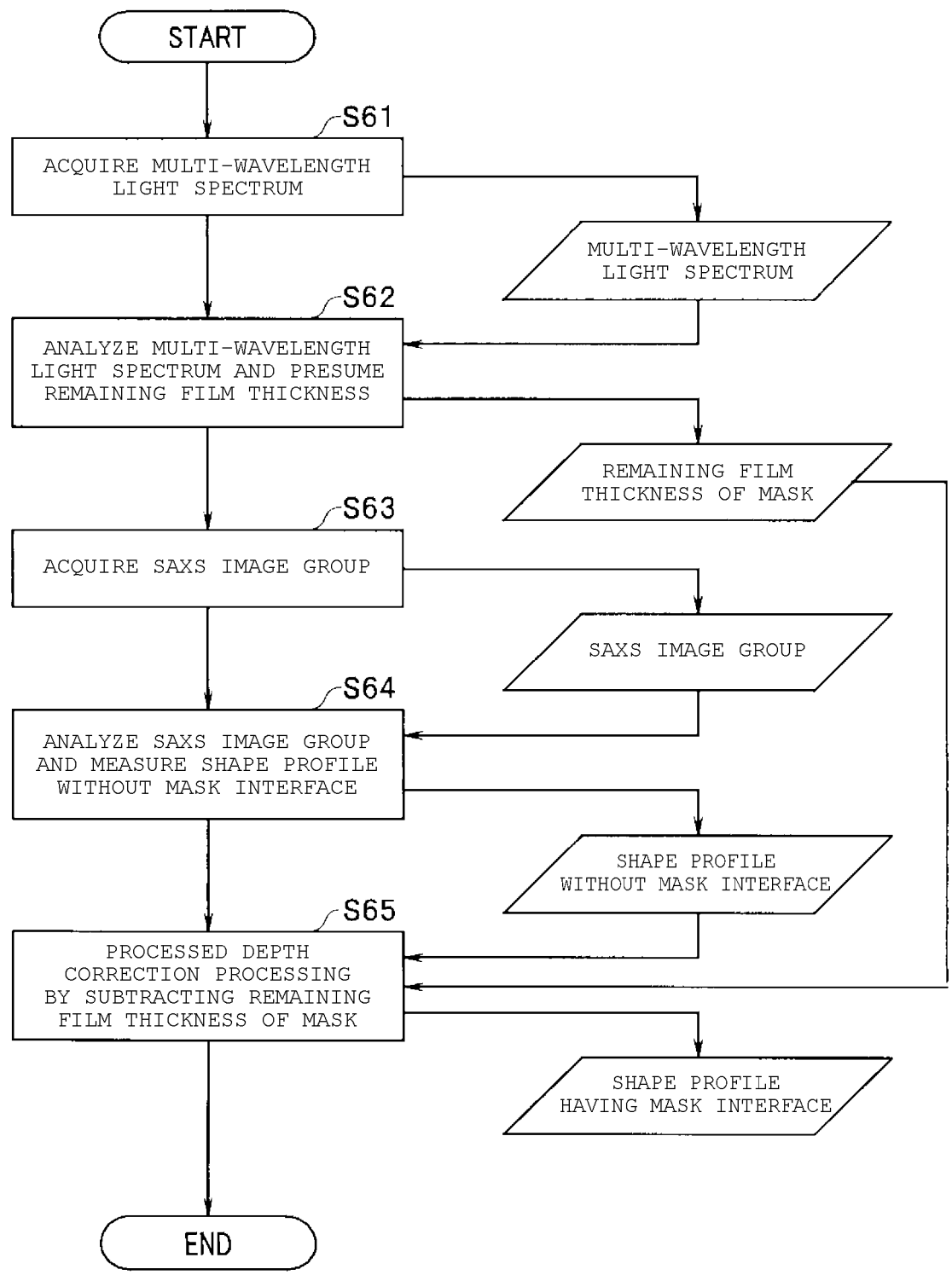
FIG. 14 is a flowchart illustrating an example of a measuring method according to the first embodiment.

The measurement system in at least one embodiment can be applied to the measurement of the processing state at the time of forming the memory hole 634. The procedures for forming the memory hole 634 when the measurement system of the embodiment is applied to the measurement of the processing state will be described with reference to FIG. 13 and FIG. 14. FIG. 13 is a flowchart illustrating an example of a procedure for forming a memory hole. FIG. 14 is a flowchart illustrating an example of the measuring method in the first embodiment.

First, the silicon oxide film and the silicon nitride film are alternately deposited on the semiconductor substrate 71 to form the ON stack film 72 (STEP S1). Subsequently, the amorphous carbon as a hard mask material is deposited on the front surface of the ON stack film 72, and the etching mask film 73 is formed (STEP S2). Next, the etching mask film 73 in the region where the memory hole is formed is removed, and an opening (memory hole pattern) is formed in the etching mask film 73 (STEP S3).

Subsequently, dry etching (anisotropic etching) is performed of the ON stack film 72 (STEP S4). As described above, since a film thickness of the ON stack film 72 is thick and a diameter of the memory hole is small, it is necessary to form a hole having a high aspect ratio. Therefore, the etching is performed in a plurality of stages. During the etching, in order to determine the end point of etching, a detection (end point detection) of whether or not the semiconductor substrate 71 is exposed at the bottom of the opening (STEP S5). When the semiconductor substrate 71 is detected (YES in STEP S5), it is considered that the hole formed by etching has penetrated the ON stack film 72, and etching is stopped and the formation of the memory hole is completed.

On the other hand, at a time when the first stage etching is completed, if the semiconductor substrate 71 is not detected by the end point detection (NO in STEP S5), the etching is temporarily stopped, and the hole processing state (remaining film thickness of the etching mask film 73, etching depth of the ON stack film 72, cross-sectional shape, for example) is measured by the measurement system in at least one embodiment (STEP S6).

The detailed procedure of STEP S6 will be described with reference to the flowchart in FIG. 14. In FIG. 14, the rectangles indicate the procedures, and the parallelograms indicate the data. The arrow from the rectangle to the parallelogram indicates that the data indicated in the parallelogram will be generated (acquired) when the procedure indicated in the rectangle is performed. In addition, the arrow from the parallelogram to the rectangle indicates that the data indicated in the parallelogram is used in the procedure indicated in the rectangle.

First, a semiconductor wafer in the process of forming the memory hole pattern is used as the subject 7, and the multi-wavelength light measuring device 3 acquires the diffracted light intensity spectrum (multi-wavelength light spectrum) (STEP S61). Next, the analysis unit 34 of the multi-wavelength light measuring device 3 analyzes the diffracted light intensity spectrum acquired in STEP S61, and presumes the remaining film thickness Tm of the etching mask film 73 formed on the front surface of the subject 7 (STEP S62).

Subsequently, the subject 7 is conveyed to the T-SAXS measuring device 2, and the T-SAXS measuring device 2 performs the measurement while changing the rotation angle of the measuring stage 22 to acquire a plurality of diffraction images (SAXS image group) (STEP S63). The analysis unit 24 of the T-SAXS measuring device 2 analyzes the SAXS image group acquired in STEP S63, and presumes a three-dimensional shape of the memory hole (hole) formed in the subject 7 at the time of measurement (STEP S64).

The T-SAXS measuring device 2 can measure the three-dimensional shape of the front surface of the subject 7 with high accuracy. On the other hand, when two films made of a material with a small difference in electron density are stacked, the interface between the two films cannot be detected because the respective films cannot be analyzed separately. Therefore, in the three-dimensional shape generated in STEP S64, a three-dimensional shape of the hole formed by etching is presumed, but the interface between the etching mask film 73 and the ON stack film 72 (and the interface between the ON stack film 72 and the semiconductor substrate 71) cannot not be detected. That is, the depth Ta from the front surface of the etching mask film 73 to the bottom of the processed hole can be presumed, but the remaining film thickness Tm of the etching mask film 73 and the etching depth Th of the ON stack film 72 cannot be presumed. As described above, in STEP S64, a three-dimensional shape (shape profile without the mask interface) of the processed hole in which the interface between the etching mask film 73 and the ON stack film 72 is not presumed is generated.

When forming a hole with a large aspect ratio such as a memory hole, etching is performed for a long time. During etching, the etching rate is smaller than that of the ON stack film 72 which is the film to be etched, but the etching mask film 73 is also gradually scraped. When all the etching mask film 73 is scraped off, the ON stack film 72 is exposed on the upper surface of the subject 7. When etching is continued in a state in which the ON stack film 72 is exposed on the upper surface of the subject 7, since not only the bottom of the opening but also the front surface of the ON stack film 72 will be etched, the wiring layer to be formed in the later process cannot be formed, and the product becomes defective.

As described above, when forming a hole having a large aspect ratio such as a memory hole, it is important to control the remaining film thickness of the etching mask film 73 as well as the three-dimensional shape of the processed hole. Therefore, in the measurement of the processing shape in STEP S6, it is necessary to measure the three-dimensional shape in which the interface position between the etching mask film 73 and the ON stack film 72 is specified. Therefore, in the following STEP S65, the three-dimensional shape (shape profile having the mask interface) of the processed hole in which the interface between the etching mask film 73 and the ON stack film 72 is presumed is generated using the shape profile without the mask interface generated in STEP S64 and the mask remaining film thickness Tm obtained in STEP S62. STEP S64 may be performed by the analysis unit 24 of the T-SAXS measuring device 2 or may be executed by the host computer 4.

Specifically, STEP S65 is executed as follows. That is, in the shape profile without the mask interface generated in STEP S64, a region from the front surface to the remaining film thickness Tm of the mask is presumed as with etching mask film 73 using the remaining film thickness Tm of the mask measured in STEP S62, the depth Th of the processed hole is calculated by subtracting the remaining film thickness Tm of the mask from the depth Ta from the front surface to the bottom of the processed hole. Then, in the shape profile without the mask interface, the shape profile having the mask interface, in which the mask interface is at a position away from the front surface as much as the remaining film thickness Tm of the mask, is generated. That is, the shape profile without the mask interface has the same three-dimensional shape as the shape profile having the mask interface, but it is different in a point that the interface position between the etching mask film 73 and the ON stack film 72 is specified.

By executing the above-described procedure from STEP S61 to STEP S65, the measurement of the hole processing state (remaining film thickness of the etching mask film 73, the etching depth of the ON stack film 72, the cross-sectional shape, for example) in STEP S6 is executed.

In the following STEP S7, the etching parameters of the next stage are adjusted as necessary based on the shape profile having the mask interface measured in STEP S6. Then, returning to STEP S4, etching of the next stage of ON stack film 72 is performed. The series of procedures from STEP S4 to STEP S7 is repeatedly executed until the end point is detected in STEP S5.

When measuring the shape profile having the mask interface, generally, a cross-section (scanning electron microscopy (SEM) is used. Since only the observation of the front surface can be performed using the cross-section SEM, it is necessary to cut the measurement target in STEP S6 at the position where the shape profile is to be obtained, and prepare a cross-section sample. Therefore, since it takes time to prepare a cross-section sample in addition to measurement, which becomes a cause of prolonging the process development in the process of forming the memory hole. On the other hand, the measurement system in at least one embodiment can measure the semiconductor substrate for the product as it is, and there is no need to prepare a sample for the measurement. Therefore, since the time required for the measurement is short, the process development period of the memory hole forming process can be shortened.

In addition, since the cross-section SEM is a destructive inspection, it is necessary to prepare a semiconductor substrate for the measurement separately from the semiconductor substrate to be processed for the product to process in the same process as the product. When etching is performed in a plurality of stages, the measurement of the shape profile is performed at the end of each stage. Since the shape profile is measured multiple times, it is necessary to prepare and process the semiconductor substrate for the measurement as many times as the number of times of measurements. On the other hand, since the measurement system in the embodiment can measure the three-dimensional shape profile in a non-destructive manner, the semiconductor substrate after the measurement can be continuously processed. In addition, only the two-dimensional shape profile can be measured by the cross-section SEM, and thus, the three-dimensional shape profile cannot be measured. Therefore, depending on the cutting direction, for example, the deviation of the central axis of the hole may not be detected. On the other hand, the measurement system in at least one embodiment can measure the three-dimensional shape profile, therefore, the processing shape of the hole can be comprehensively evaluated. Therefore, the detection accuracy of processing defects in the etching process is improved. In addition, if there is a possibility of occurring the processing defects, since the etching conditions (parameters) of the next stage can be adjusted based on the three-dimensional shape profile, it is possible to prevent the processing defects from occurring in advance.

As described above, according to the measuring device in at least one embodiment, the interface between the etching mask and the film to be processed, and the shape profile of the hole processed by etching can be measured accurately in a non-destructive manner. As a result, a turn around time (TAT) required for process development of the etching process for forming a hole in the semiconductor storage device can be shortened. In addition, since the shape profile of the hole can be measured using the product in the process of processing, it is possible to reduce the manufacturing cost because there is no need to separately prepare a sample for the measurement. Furthermore, since the three-dimensional shape profile of the hole in which the mask interface is specified can be measured with high accuracy, the detection accuracy of processing defects can be improved, and thus, it is possible to prevent processing defects from occurring in advance.

The measuring device in at least one embodiment can be applied not only to the inspection (measurement of the processing shape) of the etching process (particularly, the etching process of forming the hole having a large aspect ratio such as a memory hole) in the manufacture of the semiconductor storage device as described above, but also can be used in various other situations. For example, it can also be applied to the optimization of etching conditions prior to the manufacture of the product. When each stage of etching is completed, by measuring the shape profile in which the mask interface is specified using the measurement system in at least one embodiment, the optimum parameters (etching conditions) at each stage of etching can be determined, and further, it is possible to determine the optimum mask film thickness (the film thickness of the etching mask material to be deposited on the front surface of the processed target material). As a result, since the processing can be performed under the optimum process conditions when manufacturing the product, the processing accuracy can be improved and it is possible to improve the product yield.

In addition, the measuring device in at least one embodiment can be applied to the measurement of not only a semiconductor storage device having a structure in which the peripheral circuit region 500 and the memory region 600 are arranged side by side on the semiconductor substrate 71 as illustrated in FIG. 11, but also can be applied to the measurement of a semiconductor storage device having another structure. For example, as illustrated in FIG. 15, the measuring device in at least one embodiment can also be applied to the measurement of deep hole processing such as a memory hole in the semiconductor storage device having a structure in which a peripheral circuit region 500 is formed on the semiconductor substrate 71 and a memory region 600 is formed on the upper layer of the peripheral circuit region 500.

Figure 15:
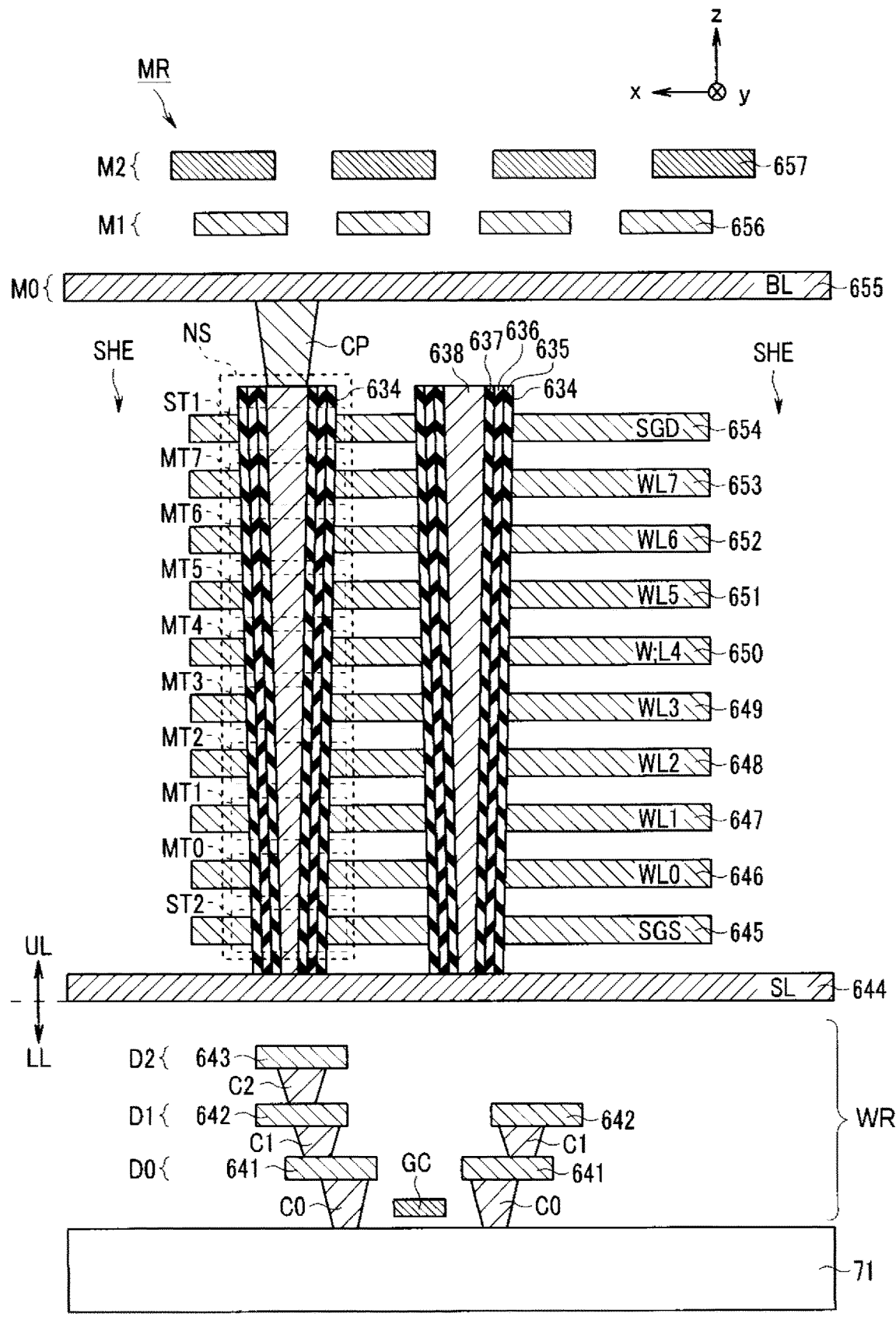
FIG. 15 is a cross-sectional view of a part of region of a semiconductor storage device having a memory cell array of a NAND memory having a three-dimensional structure.

FIG. 15 is a cross-sectional view of a part of a region of a semiconductor storage device having a peripheral circuit region and a memory cell array of NAND memory having a three-dimensional structure formed on the peripheral circuit region. FIG. 15 illustrates a semiconductor storage device having a CUA structure.

As illustrated in FIG. 15, in the memory region MR, the non-volatile memory includes a semiconductor substrate 71, conductors 641 to 657, a memory hole 634, and contact plugs C0, C1, C2 and CP. In the drawings described below, a p-type or n-type well region formed on the upper surface portion of the semiconductor substrate 71, an impurity diffusion area formed in each well region, and an element isolation area that insulates between the well regions, are omitted.

In the memory region MR, for example, a plurality of contacts C0 are provided on the semiconductor substrate 71. The plurality of contacts C0 are connected to the impurity diffusion area (not illustrated) provided on the semiconductor substrate 71. The memory cell array of the NAND memory is disposed on the semiconductor substrate 71 via the wiring layer region WR. Peripheral circuits such as input output circuits are also formed in the wiring layer region WR.

A conductor 641 forming a wiring pattern is provided on each contact C0. A part of a plurality of wiring patterns of the conductor 641 is a part of the bit line BL described above. In addition, another part of the plurality of wiring patterns is apart of the wirings of various transistors. In that case, a gate electrode GC is provided in the vicinity of the region between the adjacent conductors 641, and in this case, one of the adjacent conductor 641 is connected to the drain of the transistor and the other conductor 31 is connected to the source of the transistor.

For example, a contact C1 is provided on each conductor 641. For example, a conductor 642 is provided on each contact C1. For example, a contact C2 is provided on the conductor 642. For example, a conductor 643 is provided on the contact C2.

Each wiring pattern of the conductors 641, 642, and 643 is disposed in the wiring layer region WR between the sense amplifier circuit and the memory cell array (not illustrated). Hereinafter, the wiring layers provided with the conductors 641, 642, and 643 are referred to as wiring layers D0, D1, and D2, respectively. The wiring layers D0, D1 and D2 are provided in the lower layer of the non-volatile memory 2. The wiring layer region WR is provided with three wiring layers, but the wiring layer region WR may be provided with equal to or less than two wiring layers or equal to or more than four wiring layers.

For example, a conductor 644 is provided above the conductor 643 via an interlayer insulating film. The conductor 644 is, for example, a source line SL formed in a plate shape which is parallel to the xy-plane. For example, the conductors 645 to 654 are stacked above the conductor 644 in an order corresponding to each string unit SU. Among these conductors, an interlayer insulating film (not illustrated) is provided between the conductors that are adjacent to each other in the z-direction.

The structure corresponding to one string unit SU is provided between adjacent slit SHEs. The slit SHE spreads in the y-direction and the z-direction, for example, and insulates between conductors 645 to 654 provided in adjacent string unit SUs (not illustrated).

Each of the conductors 645 to 654 is formed in a plate shape parallel to the xy-plane, for example. For example, the conductor 645 corresponds to select gate line SGS, the conductors 646 to 653 correspond to the word lines WL0 to WL7, respectively, and the conductor 654 corresponds to the select gate line SGD.

Each memory hole 634 is provided in a columnar shape penetrating each of the conductors 645 to 654 and is in contact with the conductor 644. In the memory hole 634, for example, a block insulating film 635, a charge storage film 636, and agate insulating film 637 are sequentially formed, and further, a conductor column 638 is embedded in the memory hole 634.

For example, an intersection portion of the memory hole 634 and the conductor 645 functions as the select transistor ST2. Intersection portions of the memory hole 634 and each of the conductors 645 to 654 function as the memory cell transistor (memory cell) MT. An intersection portion of the memory hole 634 and the conductor 654 functions as the select transistor ST1.

A conductor 655 is provided on the upper layer of the upper surface of the memory hole 634 via an interlayer insulating film. The conductor 655 is formed in a line shape extending in the x-direction to correspond to the bit line BL. The plurality of conductors 655 are arranged with an interval in the y-direction (not illustrated). The conductor 655 is electrically connected to the conductor column 638 in one memory hole 634 corresponding to each string unit SU.

Specifically, in each string unit SU, for example, the contact plug CP is provided on the conductor column 638 in each memory hole 634, and one conductor 645 is provided on the contact plug CP. The configuration is not limited to this, and the conductor columns 638 and the conductor 655 in the memory hole 634 may be connected to each other via a plurality of contacts, wirings, or the like.

A conductor 656 is provided on the upper layer of the layer on which the conductor 655 is provided via an interlayer insulating film. A conductor 657 is provided on the upper layer of the layer on which the conductor 656 is provided via an interlayer insulating film.

For example, the conductors 656 and 657 correspond to the wiring for connecting the wiring provided in the memory cell array and the peripheral circuit provided under the memory cell array. The conductors 656 and 657 may be connected to each other by a contact having a columnar shape (not illustrated). Here, the layer on which the conductor 655 is provided is referred to as a wiring layer M0, the layer on which the conductor 656 is provided is referred to as a wiring layer M1, and the layer on which the conductor 657 is provided is referred to as a wiring layer M2.

As illustrated in FIG. 15, for the semiconductor storage device having a structure in which the peripheral circuit is disposed on the lower layer of the memory cell array, when measuring the processing shape of a hole in the processing process (etching process) of the memory hole using the measurement system 1 in at least one embodiment, in the measurement using the multi-wavelength light measuring device 3, there is a possibility that the reflected light from the wiring layers D0 to D2 on the lower layer of the memory hole interferes with the reflected light from the processed hole, and thus, accurate measurement results cannot be obtained. Therefore, in order to reduce the influence of the reflected light from the wiring layers D0 to D2, it is desirable that the wiring pattern of the wiring layers D0 to D2 be a pattern as illustrated in FIG. 16 and FIG. 17.

Figure 16:
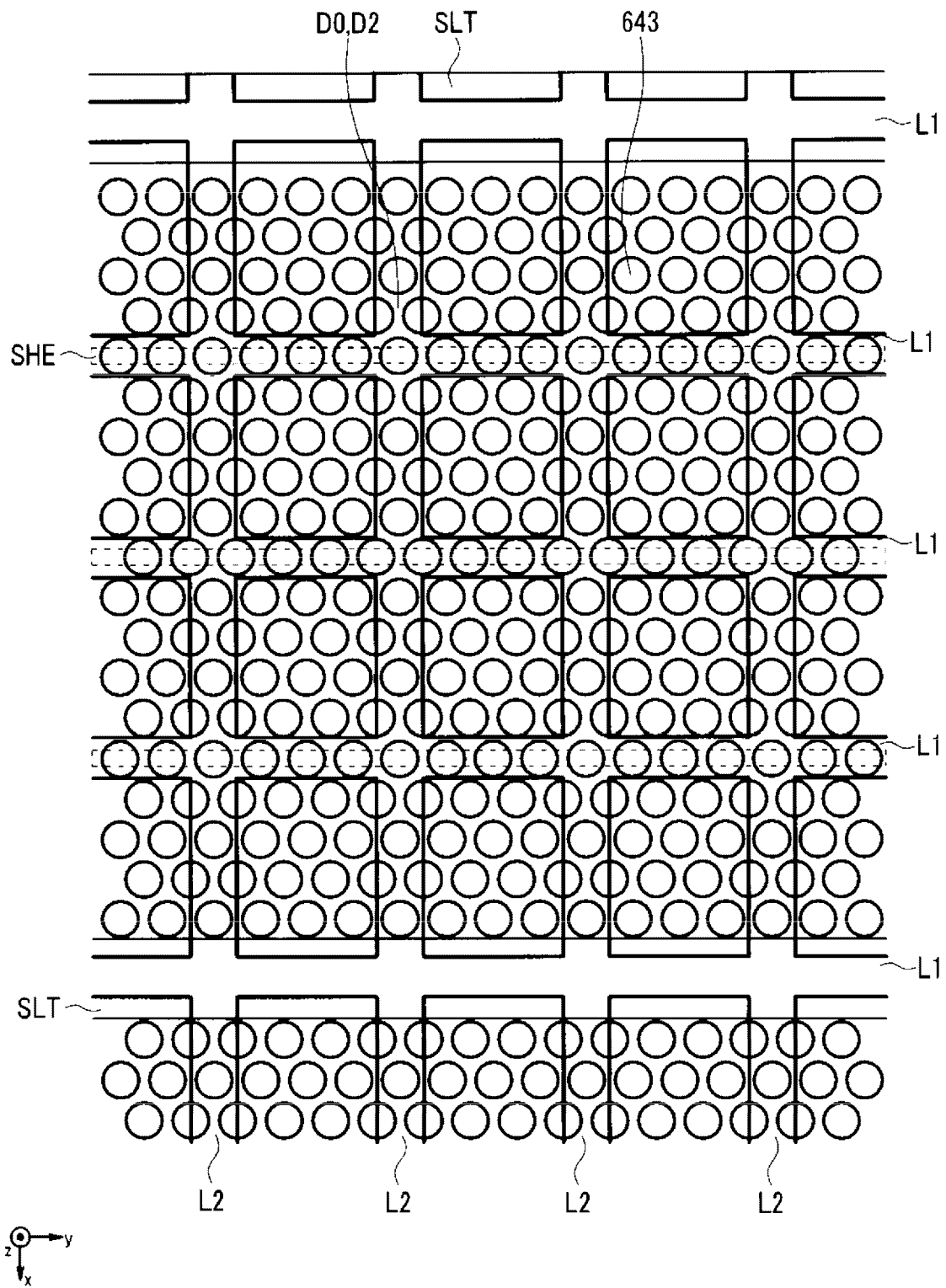
FIG. 16 is a schematic plan view illustrating an example of a wiring pattern laid at the lower portion of the memory cell array.
Figure 17:
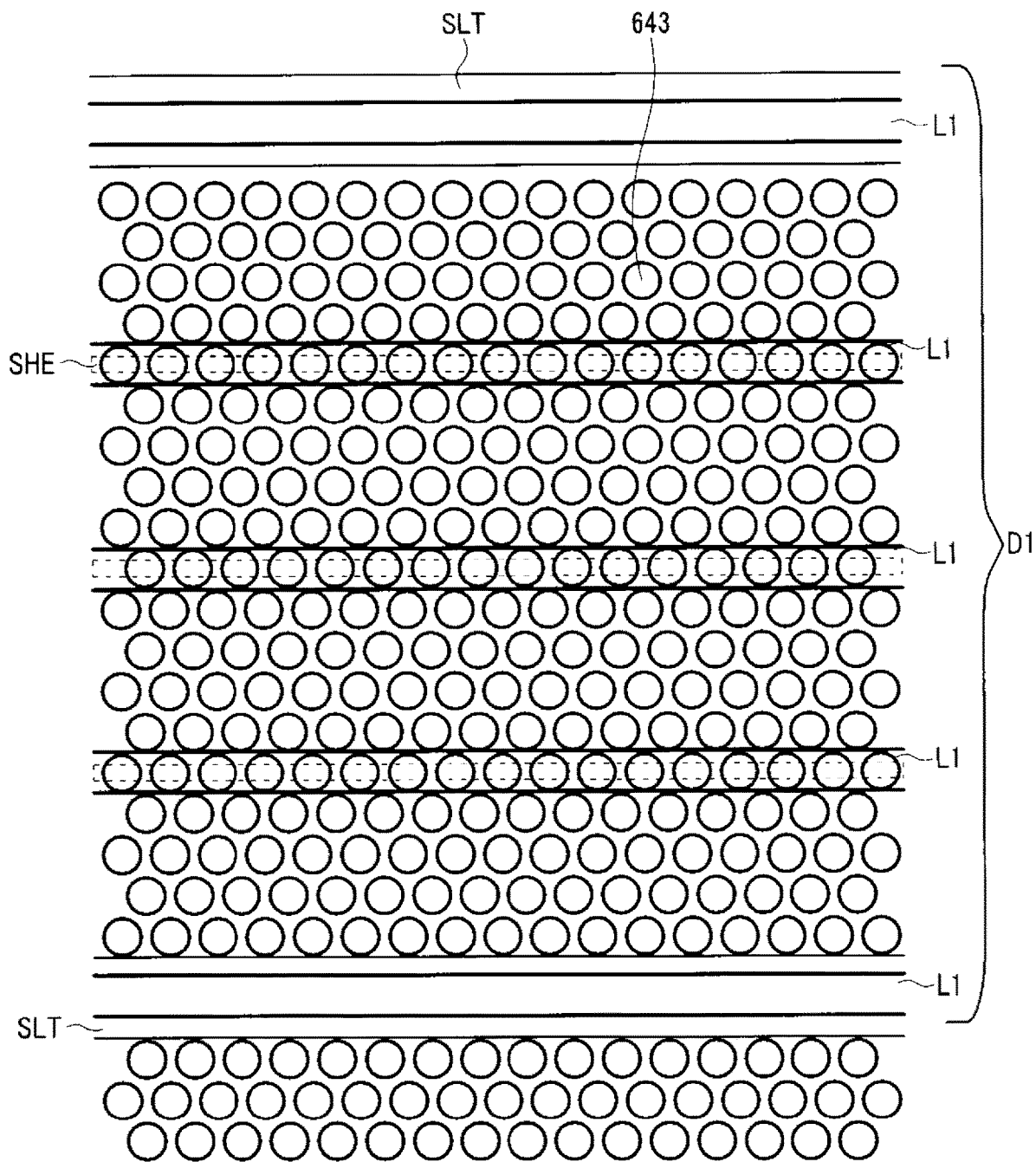
FIG. 17 is a schematic plan view illustrating an example of a wiring pattern laid at the lower portion of the memory cell array.

FIG. 16 and FIG. 17 are schematic plan views illustrating an example of a wiring pattern laid at the lower portion of the memory cell array. FIG. 16 illustrates an example of the wiring pattern of the wiring layers D0 to D2, and FIG. 17 illustrates another example of the wiring pattern of the wiring layers D0 to D2. In FIG. 16 and FIG. 17, circles indicate the memory holes 634 that configures the NAND string. The slit SLT extending in the y-direction is an insulating layer that separates the string unit SU in one block from the string unit SU in another block. The block is configured with a plurality of string units SU, and the data written in the memory cell MT of the string units SU in the same block are collectively erased. The slit SLT extends to the source line SL in the z-direction.

The slit SHE extending in the y-direction is an insulating layer that separates a plurality of string units SU in one block from each other. FIG. 16 and FIG. 17 illustrate an example in which four string units SU are formed in one block. That is, three slits SHE are provided between the slit SLT. The slit SHE extends in the z-direction to the conductor 654 that configures the select gate line SGD, and the select gate line SDG is separated between the adjacent string unit SUs by the slit SHE.

As illustrated in FIG. 16, the wiring layers D0 and D2 are formed in a grid pattern that is configured with a plurality of first wirings L1 extending in the direction in which the slit SLT and SHE extend (y-direction), and a plurality of second wiring L2 extending in the direction orthogonal to the direction in which the slit SLT and SHE extend (x direction), in the plane parallel to the front surface of the semiconductor substrate 71 (in the xy-plane). The first wiring L1 is formed in a pattern at a pitch that is an integral multiple of the pitch of the memory hole. The second wiring L2 is formed in a pattern such that a periodic pattern having a pitch that is an integral multiple of the memory hole repeats at the pitch of the slit SHE. As described above, by forming a plurality of first wirings L1 and a plurality of second wirings L2 in the grid patterns, in the measurement by the multi-wavelength measuring device 3, it is possible to prevent the irradiation light from entering the lower layer of the wiring layer D2. In addition, by arranging the first wiring L1 and the second wiring L2 configuring each wiring layer D0 to D2 at the pitch described above, the size of the shape model premised on the periodic boundary used in the T-SAXS measuring device 2 and the multi-wavelength light measuring device 3 can be reduced. Thus, it is possible to reduce the calculation cost of the simulation.

As illustrated in FIG. 17, the wiring layers D0 to D2 may be configured with only a plurality of first wirings L1 arranged at the pitch described above. Alternatively, it may be configured with only a plurality of second wirings L2 arranged at the pitch described above. However, it is preferable that at least one wiring layer out of the wiring layers D0 to D2 is formed in a grid pattern as illustrated in FIG. 16.

SECOND EMBODIMENT

Next, a second embodiment will be described. In the measuring device in the second embodiment, the method of analyzing the shape profile by the analysis unit 24 of the T-SAXS measuring device 2 is different from that in the first embodiment described above. Since the configuration of the measurement system 1 and the structure of the subject 7 to be measured are the same as those in the first embodiment described above, the description thereof will be omitted, and hereinafter, only the points different from the first embodiment will be described.

Figure 18:
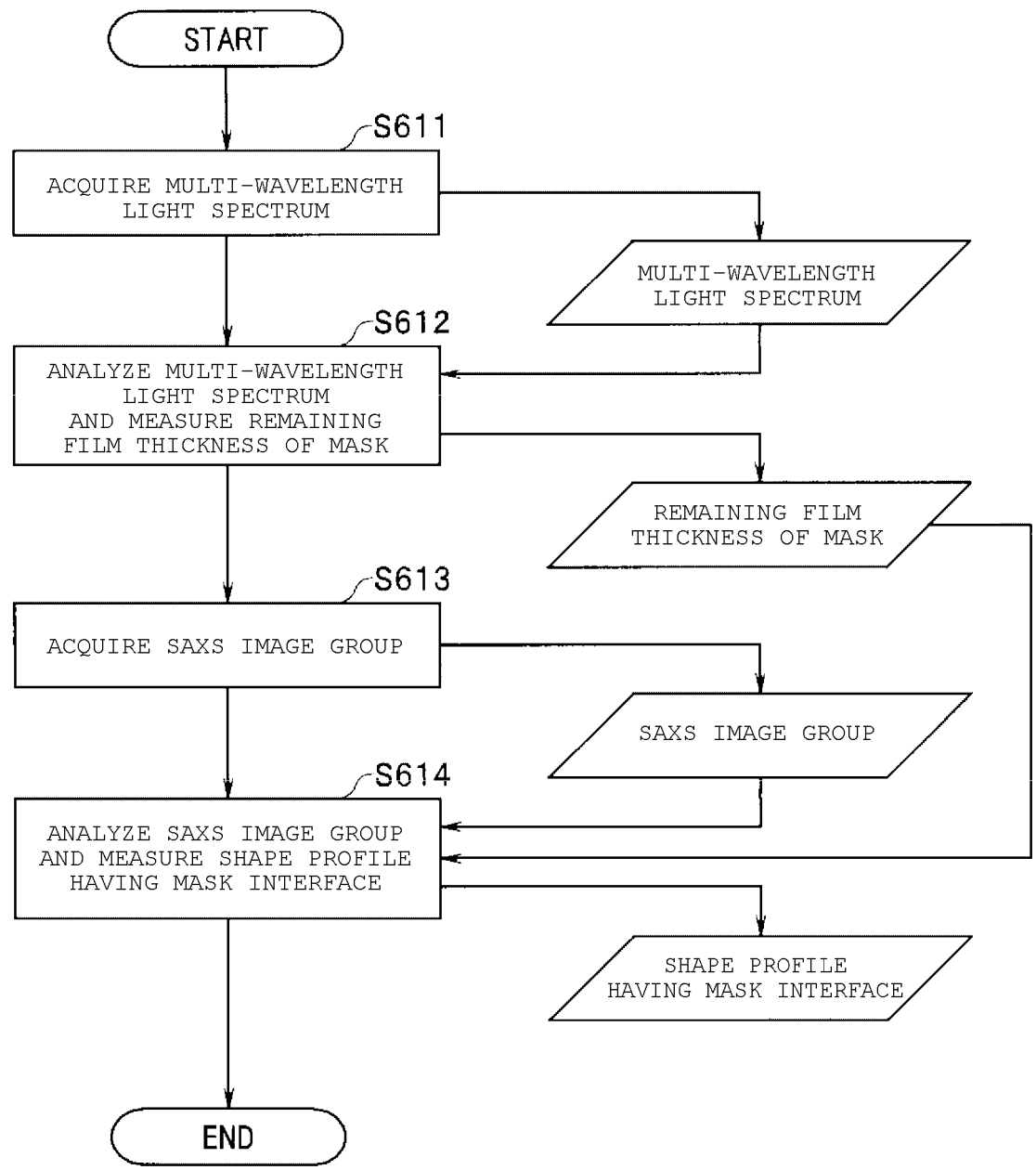
FIG. 18 is a flowchart illustrating an example of a measuring method according to a second embodiment.

FIG. 18 is a flowchart illustrating an example of the measuring method in the second embodiment. The rectangles, parallelograms, and arrows illustrated in the drawing have the same meaning as in FIG. 14. First, a semiconductor wafer in the process of forming the memory hole pattern is used as the subject 7, and the multi-wavelength light measuring device 3 acquires the diffracted light intensity spectrum (multi-wavelength light spectrum) (STEP S611). Next, the analysis unit 34 of the multi-wavelength light measuring device 3 analyzes the diffracted light intensity spectrum acquired in STEP S611, and presumes the remaining film thickness Tm of the etching mask film 73 formed on the front surface of the subject 7 (STEP S612). Subsequently, the subject 7 is conveyed to the T-SAXS measuring device 2 and the T-SAXS measuring device 2 performs the measurement while changing the rotation angle of the measuring stage 22 to acquire a plurality of diffraction images (SAXS image group) (STEP S613). These STEPs S611 to S613 are the same as STEPs S61 to S63 in the measuring method in the first embodiment illustrated in FIG. 14.

Subsequently, the analysis unit 24 of the T-SAXS measuring device 2 analyzes the SAXS image group acquired in STEP S613, and presumes the three-dimensional shape of the memory hole (hole) formed in the subject 7 at the time of measurement (STEP S614). In the analysis of the SAXS image group in STEP S614, the analysis unit 24 sets the remaining film thickness Tm of the etching mask film 73 generated in STEP S612 as an analysis parameter, and analyzes the three-dimensional shape. In this way, as a result of STEP S614, a three-dimensional shape (shape profile having the mask interface) of the processed hole in which the interface between the etching mask film 73 and the ON stack film 72 is presumed, is generated.

As described above, according to the measuring device in at least one embodiment, by the SAXS image group being analyzed by the T-SAXS measuring device 2 in state in which the remaining film thickness Tm of the etching mask film 73 measured by the multi-wavelength light measuring device 3 is set as a parameter, it is possible to generate the three-dimensional shape profile with high accuracy. In addition, in the first embodiment, the shape profile having the mask interface is generated by offsetting the remaining film thickness Tm of the etching mask film 73 with respect to the shape profile without the mask interface generated as a result of analysis of the SAXS image group. According to at least one embodiment, however, the shape profile having the mask interface can be directly obtained as a result of analysis of the SAXS image group. Therefore, it is possible to accurately measure the three-dimensional shape profile of the front surface of the subject 7 in a simple procedure.

THIRD EMBODIMENT

Next, a third embodiment will be described. In the measurement system in the third embodiment, the method of analyzing the shape profile differs from that in the first embodiment described above. Since the configuration of the measurement system 1 and the structure of the subject 7 to be measured are the same as those in the first embodiment described above, the description thereof will be omitted, and hereinafter, only the points different from the first embodiment will be described.

Figure 19:
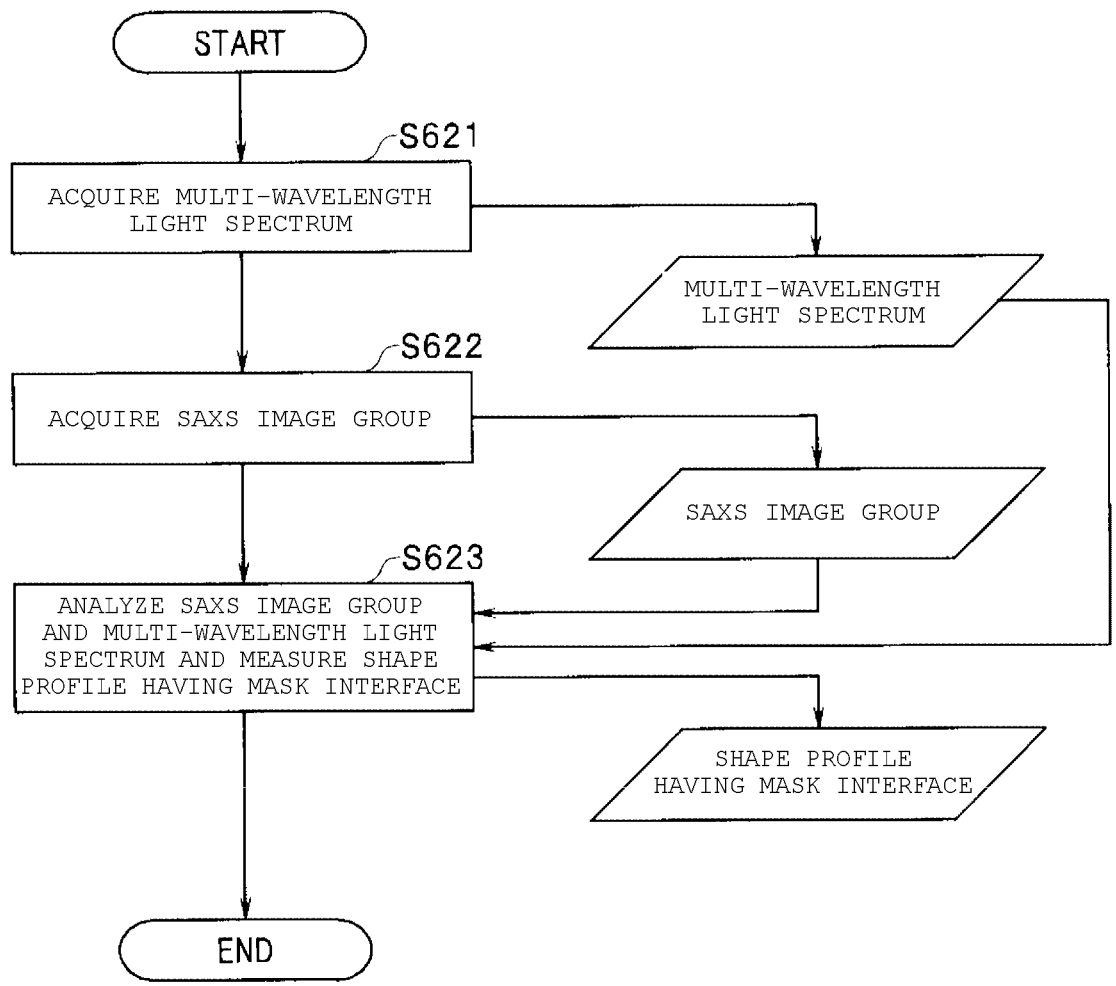
FIG. 19 is a flowchart illustrating an example of a measuring method according to a third embodiment.

FIG. 19 is a flowchart illustrating an example of a measuring method in the third embodiment. The rectangles, parallelograms, and arrows illustrated in the drawing have the same meaning as in FIG. 14. First, a semiconductor wafer in the process of forming the memory hole pattern is used as the subject 7, and the multi-wavelength light measuring device 3 acquires the diffracted light intensity spectrum (multi-wavelength light spectrum) (STEP S621). Next, the subject 7 is conveyed to the T-SAXS measuring device 2 and the T-SAXS measuring device 2 performs the measurement while changing the rotation angle of the measuring stage 22 to acquire a plurality of diffraction images (SAXS image group) (STEP S622).

Subsequently, the host computer 4 compares the diffracted light intensity spectrum acquired in STEP S621 and the SAXS image group acquired in STEP S622 with the library stored in the database 5. In the measurement system in the at least one embodiment, prior to the measurement, a set of X-ray diffracted light intensity distribution and diffracted light intensity spectrum corresponding to various three-dimensional shape patterns and film structures is calculated by an external simulator, for example, and stored in the database 5 as a library. The host computer 4 extracts a set of SAXS image group and the diffracted light intensity spectrum having the highest coincidence from the library. The three-dimensional shape pattern and the film structure corresponding to the extracted set is presumed to be the pattern and film structure formed on the front surface of the subject (STEP S623). In this way, as a result of STEP S632, a three-dimensional shape (shape profile having the mask interface) of the processed hole in which the interface between the etching mask film 73 and the ON stack film 72 is presumed, is generated.

As described above, according to the measurement system in at least one embodiment, by calculating a set of X-ray diffracted light intensity distribution and the diffracted light intensity spectrum corresponding to various three-dimensional shape patterns and film structures by simulation and preparing the result as a library in advance, an ideal analysis can be performed, and thus, it is possible to generate the most accurate three-dimensional shape profile. In addition, in at least one embodiment, since the shape profile having the mask interface can be directly obtained by analyzing the SAXS image group acquired by the T-SAXS measuring device 2 and the diffracted light intensity spectrum acquired by the multi-wavelength light measuring device 3, the procedure for calculating the remaining film thickness Tm of the etching mask film 73 becomes unnecessary. Therefore, the three-dimensional shape profile of the front surface of the subject 7 can be measured more accurately with a simple procedure.

FOURTH EMBODIMENT

Figure 20:
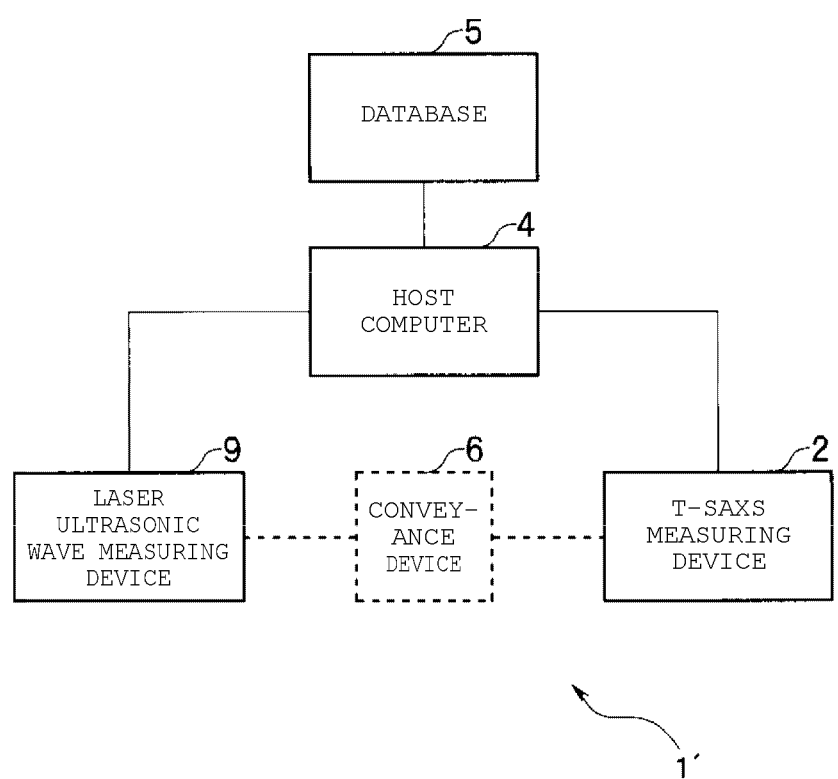
FIG. 20 is a block diagram showing a configuration example of a measurement system including a measuring device according to a fourth embodiment.

Next, a fourth embodiment will be described. As illustrated in FIG. 20, a measurement system 1' in the fourth embodiment is different from the measurement system 1 in the first embodiment described above in a point that a laser ultrasonic wave measuring device 9 is used instead of the multi-wavelength light measuring device 3. FIG. 20 is a block diagram illustrating a configuration example of a measurement system according to the fourth embodiment. Since other configuration of the measurement system 1' and the structure of the subject 7 to be measured are the same as those of the measurement system 1 in the first embodiment described above, the description thereof will be omitted, and only the points different from the first embodiment will be described below.

The laser ultrasonic wave measuring device 9 makes the front surface of the subject 7 to be irradiated with a laser beam and causes the vicinity of the front surface of the subject 7 to be instantaneously thermally expanded. Then, due to thermal expansion, ultrasonic waves are generated in the vicinity of the front surface of subject 7. The ultrasonic waves are propagated toward the inside of the subject 7 and reflected at the interface of the film. When the reflected ultrasonic wave reaches the front surface of the subject 7, the front surface of the subject 7 vibrates. By detecting the vibration of the front surface of the subject 7 due to the reflection of this ultrasonic wave, the film thickness of the film stacked on the subject 7 can be measured.

Figure 21:
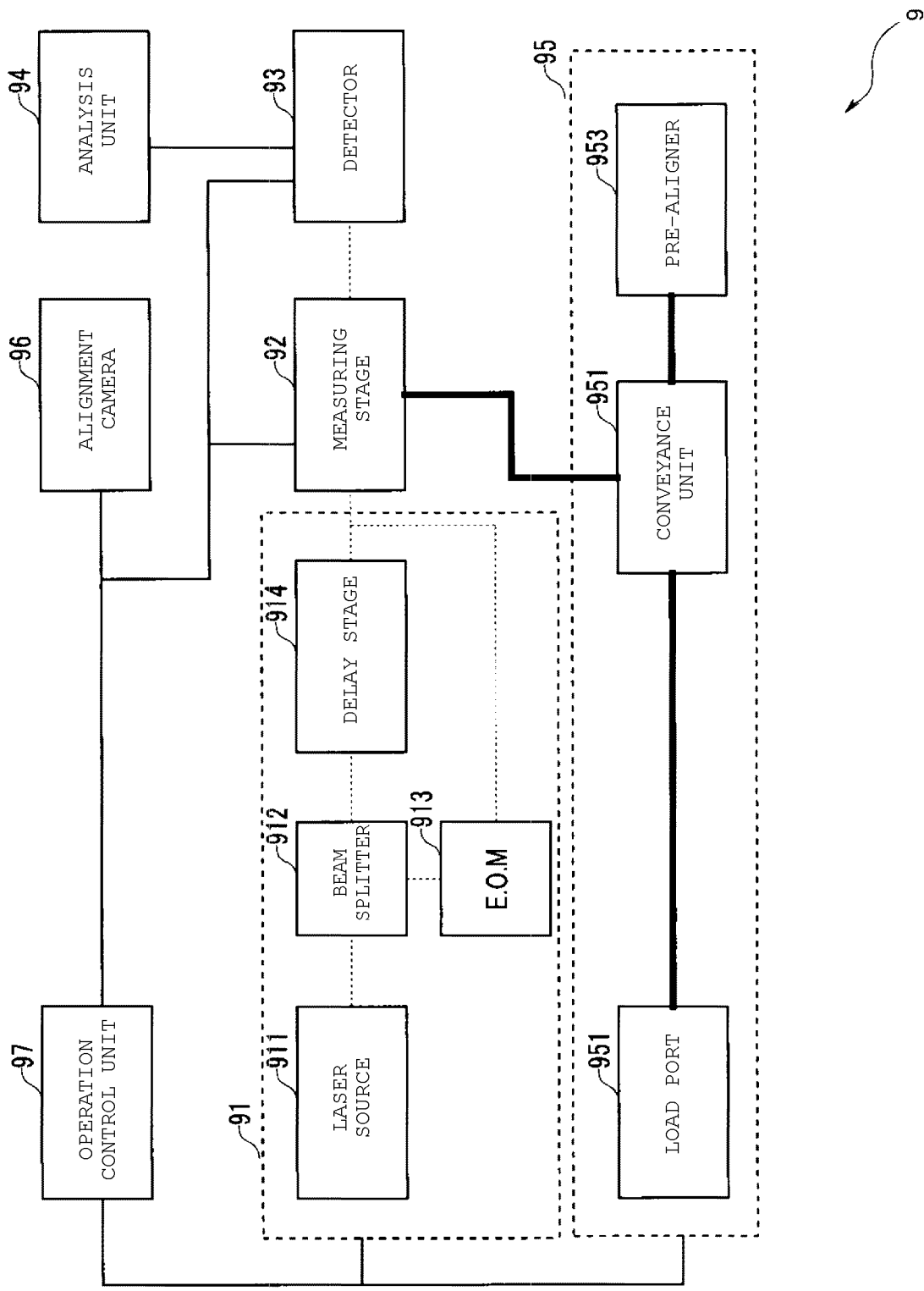
FIG. 21 is a schematic view illustrating an example of a configuration of a laser ultrasonic wave measuring device.

FIG. 21 is a schematic view illustrating an example of a configuration of the laser ultrasonic wave measuring device. The laser ultrasonic wave measuring device 9 includes a laser irradiation unit 91, a measuring stage 92, a detector 93 as a laser detection unit, and an analysis unit 94. In addition, the laser ultrasonic wave measuring device 9 also includes a conveyance unit 95, an alignment camera 96 as a position measuring unit, and an operation control unit 97. In FIG. 21, the thick lines indicate the conveyance path of the subject 7. In addition, the dotted lines indicate the optical path of the laser light. The solid lines indicate a signal transmission path for transmitting data and information (electrical signal).

The laser irradiation unit 91 is configured with a laser source 911, a beam splitter 912, and an electro optic module (E. O. M) 913 and a display stage 914. The laser source 911 generates and emits a pulse laser that serves as a pump laser for thermally expanding the subject 7 and a probe laser for detecting the vibration of the front surface of the subject 7. The beam splitter 912 splits the laser emitted from the laser source 911 in two directions. The beam splitter 912 is provided such that the laser is incident on the reflective layer (not illustrated) configuring the beam splitter 912 at an angle of 45 degrees. A part of the light flux of the laser (first light flux) is reflected by the reflective layer, and the remaining light flux (second light flux) transmits through the reflective layer.

The E. O. M 913 and the display stage 914 are provided such that the light fluxes in the two directions split by the beam splitter 912 are vertically incident. The E. O. M 913 modulates the incident first light flux. The modulated first light flux is incident on the subject 7 as a pump laser. The display stage 914 delays the incident second light flux. The delayed second light flux is incident on the subject 7 as a probe laser.

The detector 93 detects the reflected light of the probe laser incident on the subject 7. The detector 93 is configured with, for example, a plurality of semiconductor detection elements (solid-state imaging device, for example) arranged in a two-dimensional array. As the semiconductor detection elements, for example, a CCD (charge coupling element) or a CMOS image sensor is used. The reflected light of the probe laser in the imaging area of the subject 7 is photoelectrically converted by the semiconductor detection elements arranged in the projection area of the detector 334, and is output as an image signal (reflected light intensity).

The analysis unit 94 analyzes, for example, the time change of the reflectance based on the reflected light intensity output from the detector 93, and calculates the film thickness of the film stacked on the subject 7.

The conveyance unit 95 has the same configuration as the conveyance unit 25 of the T-SAXS measuring device 2 illustrated in FIG. 6. In addition, the alignment camera 96 also has the same configuration as the alignment camera 261 of the T-SAXS measuring device 2. The operation control unit 97 controls the operation of each portion of the laser ultrasonic wave measuring device 9. The operation control unit 97, for example, instructs the parameters of the laser source 911 and the detector 93 for the parameters, and instructs the operation of the measuring stage 92 and the conveyance unit 95.

Figure 22:
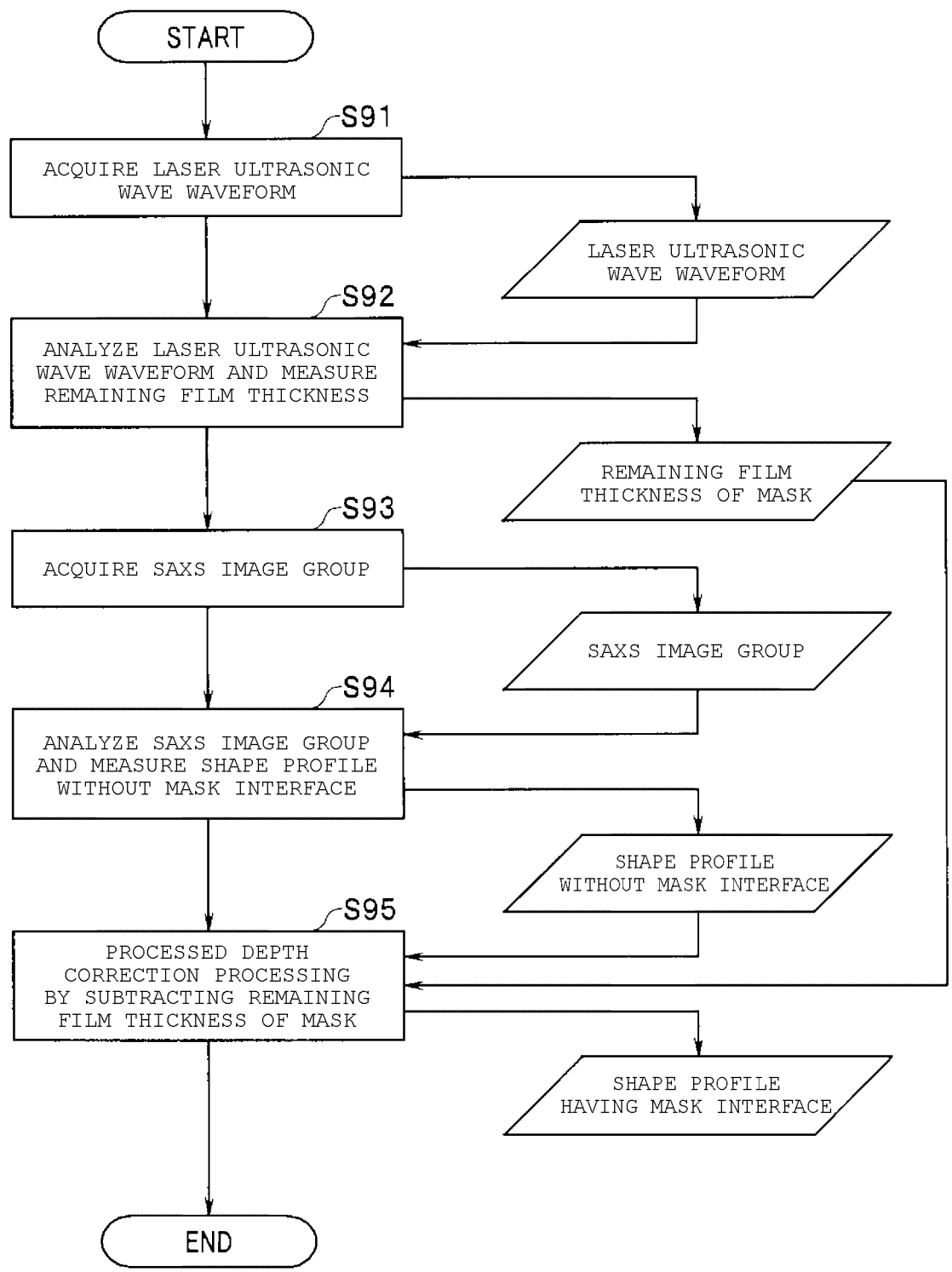
FIG. 22 is a flowchart illustrating an example of a measuring method according to the fourth embodiment.

A measuring method using the measurement system 1' configured in this way will be described with reference to FIG. 22. FIG. 22 is a flowchart illustrating an example of the measuring method in the fourth embodiment. The rectangles, parallelograms, and arrows illustrated in the drawing have the same meaning as in FIG. 14.

First, the laser ultrasonic wave measuring device 9 acquires a laser reflected light intensity waveform (laser ultrasonic waveform) (STEP S91). Next, the analysis unit 94 of the laser ultrasonic wave measuring device 9 analyzes the laser ultrasonic waveform acquired in STEP S91, and presumes the remaining film thickness Tm of the etching mask film 73 formed on the front surface of the subject 7 (STEP S92).

Subsequently, the subject 7 is conveyed to the T-SAXS measuring device 2, the T-SAXS measuring device 2 performs the measurement while changing the rotation angle of the measuring stage 22 to acquire a plurality of diffraction images (SAXS image group) (STEP S93). The analysis unit 24 of the T-SAXS measuring device 2 analyzes the SAXS image group acquired in STEP S93, and presumes a three-dimensional shape (shape profile without the mask interface) of the memory hole (hole) formed in the subject 7 at the time of measurement (STEP S94). Finally, in STEP S95, the three-dimensional shape (shape profile having the mask interface) of the processed hole in which the interface between the etching mask film 73 and the ON stack film 72 is presumed is generated using the shape profile without the mask interface generated in STEP S94 and the remaining film thickness Tm of the mask acquired in STEP S92.

As described above, according to the measuring device in at least one embodiment, the interface between the etching mask and the film to be processed, and the shape profile of the hole processed by etching can be measured non-destructively and accurately. In addition, since the film thickness is measured by propagating the ultrasonic wave inside subject 7, the laser ultrasonic wave measuring device 9 can measure the film thickness of the film (for example, a metal film) made of a material that is extremely difficult to transmit light. Therefore, according to at least one embodiment, regardless of the material of the etching mask, the interface between the etching mask and the film to be processed, and the shape profile of the hole processed by etching can be measured non-destructively and accurately.

FIFTH EMBODIMENT

Next, a fifth embodiment will be described. In the measuring device of the fifth embodiment, the method of analyzing the shape profile by the analysis unit 24 of the T-SAXS measuring device 2 is different from that the fourth embodiment described above. The configuration of the measurement system 1' and the structure of the subject 7 to be measured are the same as those in the fourth embodiment described above, and thus, the description thereof will be omitted, and only the points different from the fourth embodiment will be described below.

Figure 23:
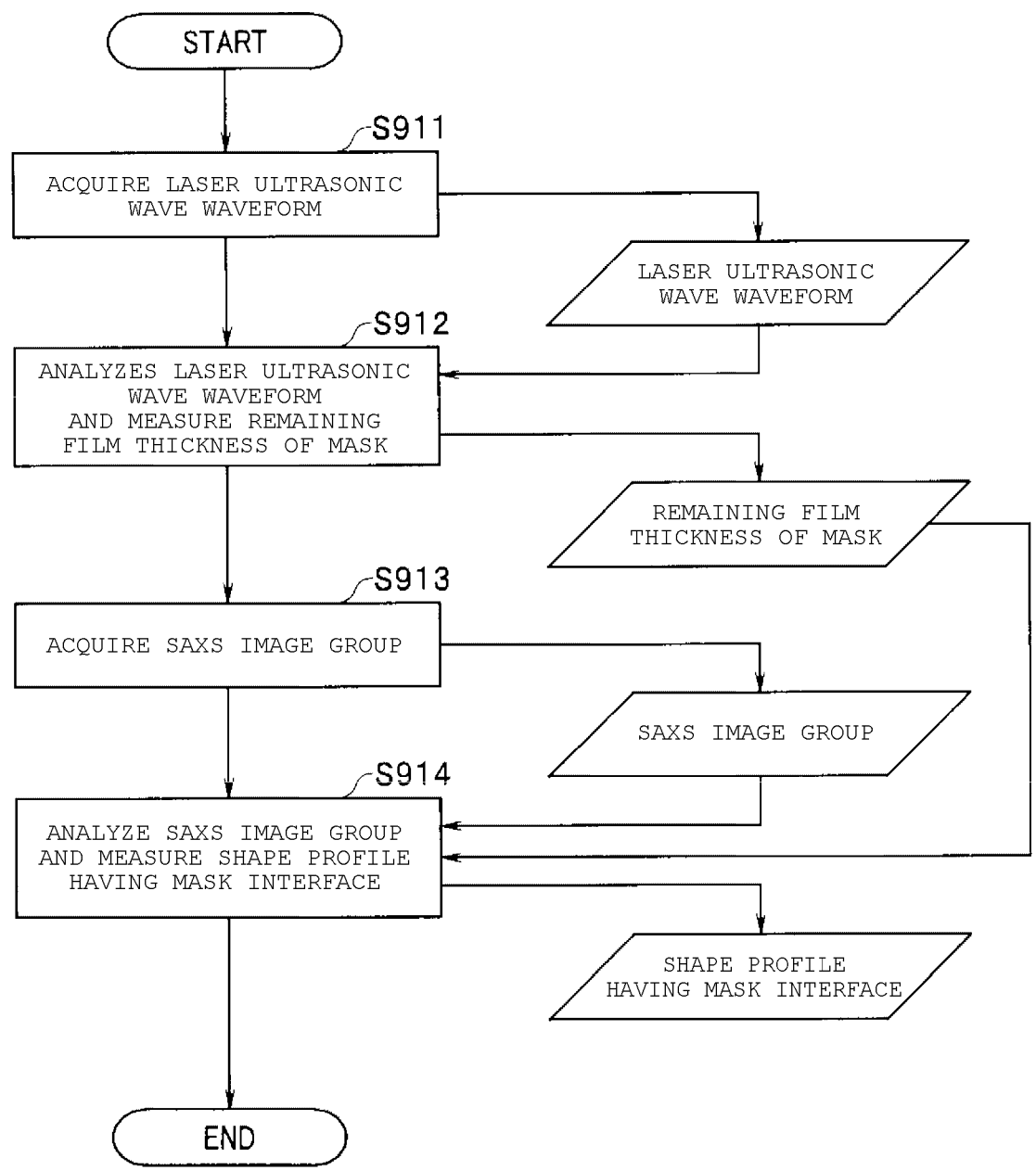
FIG. 23 is a flowchart illustrating an example of a measuring method according to a fifth embodiment.

FIG. 23 is a flowchart illustrating an example of a measuring method in the fifth embodiment. The rectangles, parallelograms, and arrows illustrated in the drawing have the same meaning as in FIG. 14. First, a semiconductor wafer in the process of forming the memory hole pattern is used as the subject 7, and the laser ultrasonic wave measuring device 9 acquires the laser reflected light intensity waveform (laser ultrasonic waveform) (STEP S911). Next, the analysis unit 94 of the laser ultrasonic wave measuring device 9 analyzes the laser ultrasonic waveform acquired in STEP S91, and presumes the remaining film thickness Tm of the etching mask film 73 formed on the front surface of the subject 7 (STEP S912). Subsequently, the subject 7 is conveyed to the T-SAXS measuring device 2, the T-SAXS measuring device 2 performs the measurement while changing the rotation angle of the measuring stage 22 to acquire a plurality of diffraction images (SAXS image group) (STEP S913). These STEPs S911 to S913 are the same as STEPs S91 to S93 in the measuring method in the fourth embodiment illustrated in FIG. 22.

Subsequently, the analysis unit 24 of the T-SAXS measuring device 2 analyzes the SAXS image group acquired in STEP S913, and presumes the three-dimensional shape of the memory hole (hole) formed in the subject 7 at the time of measurement (STEP S914). In the analysis of the SAXS image group in STEP S914, the analysis unit 24 sets the remaining film thickness Tm of the etching mask film 73 generated in STEP S912 as an analysis parameter to analyze the three-dimensional shape. In this way, as a result of STEP S914, the three-dimensional shape (shape profile having the mask interface) of the processed hole in which the interface between the etching mask film 73 and the ON stack film 72 is presumed is generated.

As described above, according to the measuring device in at least one embodiment, the T-SAXS measuring device 2 analyzes the SAXS image group in a state in which the remaining film thickness Tm of the etching mask film 73 measured by the laser ultrasonic wave measuring device 9 is set as a parameter, therefore, it is possible to generate a more accurate three-dimensional shape profile. In addition, in the fourth embodiment, the shape profile having the mask interface is generated by offsetting the remaining film thickness Tm of the etching mask film 73 from the shape profile without the mask interface generated as a result of analysis of SAXS image group, however, according to at least one embodiment, the shape profile having the mask interface can be directly obtained as the result of analysis of the SAXS image group. Therefore, it is possible to accurately measure the three-dimensional shape profile of the front surface of the subject 7 in a simple procedure.

SIXTH EMBODIMENT

Next, a sixth embodiment will be described. In the measurement system 1' in the sixth embodiment, a method of analyzing the shape profile is different from that in the fourth embodiment described. The configuration of the measurement system 1' and the structure of the subject 7 to be measured are the same as those in the fourth embodiment described above, and thus, the description thereof will be omitted, and only the points different from the fourth embodiment will be described below.

Figure 24:
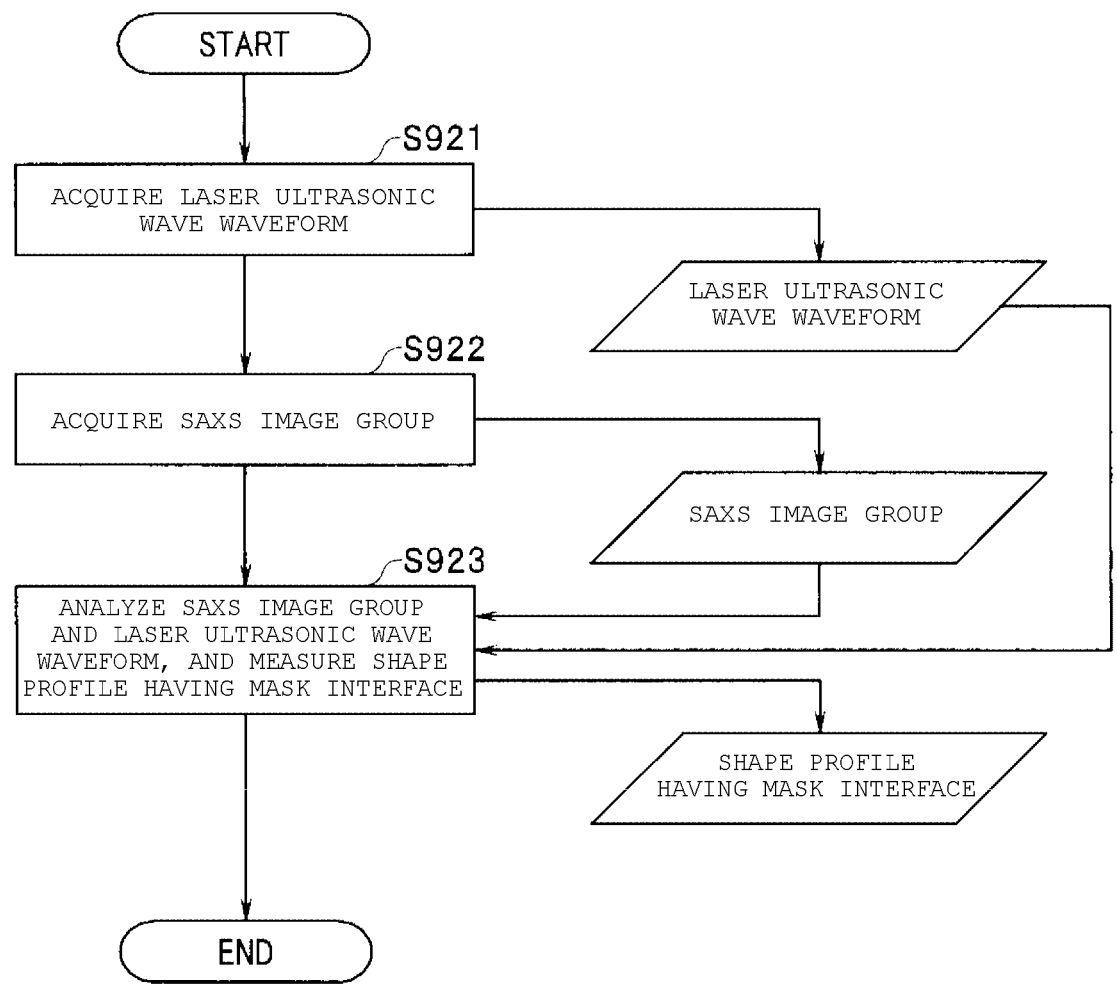
FIG. 24 is a flowchart illustrating an example of a measuring method according to a sixth embodiment.

FIG. 24 is a flowchart illustrating an example of the measuring method in the sixth embodiment. The rectangles, parallelograms, and arrows illustrated in the drawing have the same meaning as in FIG. 14. First, a semiconductor wafer in the process of forming the memory hole pattern is used as the subject 7, and the laser ultrasonic wave measuring device 9 acquires the laser reflected light intensity waveform (laser ultrasonic waveform) (STEP S921). Next, the subject 7 is conveyed to the T-SAXS measuring device 2 and the T-SAXS measuring device 2 performs the measurement while changing the rotation angle of the measuring stage 22 to acquire a plurality of diffraction images (SAXS image group) (STEP S622).

Subsequently, the host computer 4 compares the laser ultrasonic waveform acquired in STEP S921 and the SAXS image group acquired in STEP S922 with the library stored in the database 5. In the measurement system in at least one embodiment, prior to the measurement, a set of X-ray diffracted light intensity distribution and laser ultrasonic waveform corresponding to various three-dimensional shape patterns and film structures is calculated by an external simulator or the like, and stored in the database 5 as a library. The host computer 4 extracts a set of SAXS image group and the laser ultrasonic waveform having the highest coincidence from the library. The three-dimensional shape pattern and the film structure corresponding to the extracted set is presumed to be the pattern and film structure formed on the front surface of the subject 7 (STEP S923). In this way, as a result of STEP S932, a three-dimensional shape (shape profile having the mask interface) of the processed hole in which the interface between the etching mask film 73 and the ON stack film 72 is presumed, is generated.

As described above, according to the measurement system in at least one embodiment, by calculating a set of X-ray diffracted light intensity distribution and the laser ultrasonic waveform corresponding to various three-dimensional shape patterns and film structures by simulation and preparing the result as a library in advance, an ideal analysis can be performed, and thus, it is possible to generate the most accurate three-dimensional shape profile. In addition, in at least one embodiment, since the shape profile having the mask interface can be directly obtained by analyzing the SAXS image group acquired by the T-SAXS measuring device 2 and the laser ultrasonic waveform acquired by the laser ultrasonic wave measuring device 9, the procedure for calculating the remaining film thickness Tm of the etching mask film 73 becomes unnecessary. Therefore, the three-dimensional shape profile of the front surface of the subject 7 can be measured more accurately with a simple procedure.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A measuring device comprising:
a stage arranged to support a subject;
an X-ray irradiator configured to irradiate the stage with X-rays;
an X-ray detector configured to detect scattered X-rays emitted from the subject based on the irradiation by the X-ray irradiator; and
a processor configured to analyze a diffraction image obtained by photo-electrically converting the scattered X-rays,
the processor configured to:
estimate a front surface contour shape of a measurement area irradiated with the X-rays,
estimate an interface between a first film and a second film of the subject and a hole portion penetrating the second film,
wherein the processor is configured to estimate the front surface contour shape based on (i) a plurality of the diffraction images acquired by rotating the subject, and (ii) measurement data obtained by measuring the subject using at least one measuring method of a multi-wavelength light measurement or a laser ultrasonic wave measurement.

2. The measuring device according to claim 1, wherein the x-ray irradiator includes a Transmission Small Angle X-ray Scattering arrangement.

3. The measuring device according to claim 1, wherein the front surface contour shape includes a plurality of holes or grooves.

4. The measuring device according to claim 1, wherein the first film includes an etch mask and the second film includes a film to be processed.

5. The measuring device according to claim 1, wherein the first film and the second film are stacked in the measurement area.

6. The measuring device according to claim 1, wherein the stage is rotatable with respect to an axis parallel to a plane on which the subject is placed.

7. The measuring device according to claim 1, wherein the measuring method includes a Fourier transform infrared method.

8. The measuring device according to claim 1, wherein the measuring method includes a scatterometry method.

9. The measuring device according to claim 1,
wherein the measurement data includes a film thickness of the second film.

10. The measuring device according to claim 1,
wherein the measurement data includes a multi-wavelength light spectrum.

11. The measuring device according to claim 10,
wherein a longest wavelength in the multi-wavelength light spectrum is equal to or longer than 2 μm.

12. The measuring device according to claim 10,
wherein a shortest wavelength in the multi-wavelength light spectrum is equal to or longer than 190 nm, and a longest wavelength in the multi-wavelength light spectrum is equal to or shorter than 2200 nm.

13. The measuring device according to claim 1,
wherein the measurement data includes a laser ultrasonic wave measurement waveform.

14. A measuring method comprising:
irradiating a subject with X-rays;
detecting scattered X-rays emitted from the subject based on the irradiation; and
analyzing a diffraction image obtained by photo-electrically converting the scattered X-rays and estimating a front surface contour shape of a measurement area irradiated with the X-rays,
wherein a first film and a second film, the second film formed of a material different from the first film, are stacked in order in the measurement area of the subject, and a hole or groove portion penetrating the second film is formed in a part of the measurement area, and
wherein the front surface contour shape is estimated based on (i) a plurality of the diffraction images obtained by changing an irradiation angle of the X-rays to the subject and (ii) measurement data obtained by measuring the subject using at least one measuring method of a multi-wavelength light measurement or a laser ultrasonic wave measurement.

15. The method according to claim 14, wherein the first film includes an etch mask and the second film includes a film to be processed.

16. The method according to claim 14, wherein the measuring method includes a scatterometry method.

17. A semiconductor storage device as the subject measured by the measuring method of claim 14, comprising:
a NAND memory having a three-dimensional structure formed on a semiconductor substrate via one or more wiring layers, wherein the NAND memory includes a plurality of memory holes extending in a first direction, the first direction being perpendicular to a substrate surface of the semiconductor substrate, the plurality of memory holes being separated in a predetermined unit by an insulating layer extending in a second direction, the second direction being one direction horizontal to the substrate surface of the semiconductor substrate, the wiring layer including a plurality of first wirings extending in the second direction and/or a plurality of second wirings extending in a third direction, the third direction being orthogonal to the second direction in a plane parallel to the substrate surface of the semiconductor substrate, a first pattern pitch of the first wirings in the second direction is an integral multiple of a second pattern pitch of the memory holes in the second direction, and a third pattern pitch of the second wirings in the third direction is an integral multiple of a fourth pattern pitch of the memory holes in the third direction.

18. The semiconductor storage device according to claim 17,
wherein at least one of the wiring layers includes the plurality of first wirings and the plurality of second wirings, and is formed in a grid shape wiring pattern.

19. A measuring device comprising:
a stage arranged to support a subject;
an X-ray irradiator configured to irradiate the stage with X-rays;
an X-ray detector configured to detect scattered X-rays emitted from the subject based on the irradiation; and
a processor configured to analyze a diffraction image obtained by photo-electrically converting the scattered X-rays,
the processor configured to:
estimate a front surface contour shape of a measurement area irradiated with the X-rays,
estimate an interface between a first film and a second film; and
a multi-wavelength light measurement device or a laser ultrasonic wave measurement device configured to perform a measurement on the subject.

* * * * *